(12) United States Patent
Yoshida et al.

(10) Patent No.: US 10,811,405 B2
(45) Date of Patent: *Oct. 20, 2020

(54) SEMICONDUCTOR DEVICE

(71) Applicant: Renesas Electronics Corporation, Tokyo (JP)

(72) Inventors: Yuta Yoshida, Tokyo (JP); Makoto Yabuuchi, Tokyo (JP); Yoshisato Yokoyama, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/528,177

(22) Filed: Jul. 31, 2019

(65) Prior Publication Data

US 2019/0355712 A1    Nov. 21, 2019

Related U.S. Application Data

(63) Continuation of application No. 15/512,933, filed as application No. PCT/JP2015/059514 on Mar. 26, 2015, now Pat. No. 10,424,575.

(51) Int. Cl.
    *H01L 27/11*     (2006.01)
    *H01L 27/02*     (2006.01)
    *G11C 11/418*     (2006.01)
    *G11C 11/419*     (2006.01)
    *H01L 23/522*     (2006.01)
    (Continued)

(52) U.S. Cl.
CPC ........ *H01L 27/0207* (2013.01); *G11C 11/418* (2013.01); *G11C 11/419* (2013.01); *H01L 23/5226* (2013.01); *H01L 23/5286* (2013.01); *H01L 27/0924* (2013.01); *H01L 27/1104* (2013.01); *H01L 27/1116* (2013.01); *H01L 29/785* (2013.01)

(58) Field of Classification Search
CPC ..... H01L 27/0207; H01L 27/02; H01L 27/11; H01L 27/092; H01L 23/522; H01L 23/528; H01L 29/78; H01L 29/785; H01L 27/0924; H01L 27/1104; H01L 27/1116; H01L 23/5226; H01L 23/5286
USPC .......................................... 257/369
See application file for complete search history.

(56) References Cited

U.S. PATENT DOCUMENTS 6,236,117 B1     5/2001   Ishigaki et al.
10,424,575 B2 *   9/2019   Yoshida ............... H01L 23/5226
(Continued)

FOREIGN PATENT DOCUMENTS

CN          103366800 A     10/2013
JP          H 11-111860 A     4/1999
(Continued)

OTHER PUBLICATIONS

International Search Report (ISR) (PCT Form PCT/ISA/210), in PCT/JP2015/059514, dated May 19, 2015.
(Continued)

*Primary Examiner* — Chuong A Luu
(74) *Attorney, Agent, or Firm* — McGinn IP Law Group, PLLC

(57) ABSTRACT

A semiconductor device includes a semiconductor substrate, a memory cell formed on the semiconductor substrate, a word line connected to the memory cell, and an auxiliary line connected to the word line.

21 Claims, 24 Drawing Sheets

(51) Int. Cl.
*H01L 23/528* (2006.01)
*H01L 27/092* (2006.01)
*H01L 29/78* (2006.01)

(56) References Cited

U.S. PATENT DOCUMENTS

| | | |
|---|---|---|
| 2004/0196705 A1 | 10/2004 | Ishikura et al. |
| 2005/0151276 A1 | 7/2005 | Jang et al. |
| 2008/0079077 A1 | 4/2008 | Takeda et al. |
| 2008/0197419 A1 | 8/2008 | Liaw |
| 2011/0220861 A1 | 9/2011 | Himeno et al. |
| 2013/0181297 A1 | 7/2013 | Liaw |
| 2013/0258759 A1 | 10/2013 | Liaw |
| 2015/0036420 A1 | 2/2015 | Kobatake |
| 2015/0248521 A1 | 9/2015 | Liaw |
| 2016/0111141 A1 | 4/2016 | Kobatake |
| 2016/0240541 A1 | 8/2016 | Llaw |
| 2016/0276352 A1 | 9/2016 | Morimoto et al. |

FOREIGN PATENT DOCUMENTS

| | | |
|---|---|---|
| JP | 2004-311610 A | 11/2004 |
| JP | 2005-203780 A | 7/2005 |
| JP | 2006-310467 A | 11/2006 |
| JP | 2013-026594 A | 2/2013 |
| JP | 2015-032333 A | 2/2015 |
| WO | WO 2005/119763 A1 | 12/2005 |
| WO | WO 2015/019411 A1 | 2/2015 |

OTHER PUBLICATIONS

Japanese Office Action dated Aug. 29, 2017 in Japanese Application No. 2017-507302 with an English translation thereof.
Japanese Office Action dated Feb. 20, 2018 in Japanese Application No. 2017-507302 with an English translation thereof.
Extended European Search Report dated Oct. 18, 2018, in Patent Application No. 15886418.1-1212/3276653 PCT/JP2015059514.
Taiwanese Office Action dated Mar. 29, 2019, Taiwanese Patent Application No. 104143214 with an English translation.
Chinese Office Action dated Aug. 19, 2020, in Chinese Patent Application No. 201580048810.7 with an English translation.

* cited by examiner

FIG. 5

(a) PLANAR TYPE FET

| | |
|---|---|
| M0 | |
| M1 | HAVING (CONTACT WIRING) |
| M2 | HAVING (BIT LINE/POWER SUPPLY LINE) |
| M3 | HAVING (WORD LINE/POWER SUPPLY LINE) |
| M4 | HAVING (POWER SUPPLY LINE) |
| M5 | HAVING (POWER SUPPLY LINE) |

(b) FINFET

| | |
|---|---|
| M0 | HAVING (CONTACT WIRING) |
| M1 | HAVING (BIT LINE/POWER SUPPLY LINE) |
| M2 | HAVING (WORD LINE/POWER SUPPLY LINE) |
| M3 | SPACE — EFFECTIVELY UTILIZED |
| M4 | HAVING (POWER SUPPLY LINE) |
| M5 | HAVING (POWER SUPPLY LINE) |

FIG. 12

(a) PLANAR TYPE FET

| M0 | |
|---|---|
| M1 | (CONTACT WIRING) (SIGNAL WIRING /POWER SUPPLY LINE) |
| M2 | (SIGNAL WIRING /POWER SUPPLY LINE) |
| M3 | (SIGNAL WIRING /POWER SUPPLY LINE) |
| M4 | (POWER SUPPLY LINE) |

(b) FINFET

| M0 | (CONTACT WIRING) (SIGNAL WIRING /POWER SUPPLY LINE) |
| M1 | (SIGNAL WIRING /POWER SUPPLY LINE) |
| M2 | (SIGNAL WIRING /POWER SUPPLY LINE) |
| M3 | SPACE |
| M4 | (POWER SUPPLY LINE) |

EFFECTIVELY UTILIZED →

(c) FINFET

| M0 | (CONTACT WIRING) (SIGNAL WIRING /POWER SUPPLY LINE) |
| M1 | (SIGNAL WIRING /POWER SUPPLY LINE) |
| M2 | (SIGNAL WIRING /POWER SUPPLY LINE) |
| M3 | (SIGNAL WIRING /POWER SUPPLY LINE) |
| M4 | (POWER SUPPLY LINE) |

SEMICONDUCTOR DEVICE

This Application is a Continuation Application of U.S. patent application Ser. No. 15/512,933, which was filed on Mar. 21, 2016, and the disclosure of which is incorporated herein in its entirety by reference thereto.

TECHNICAL FIELD

The present invention relates to a semiconductor device, and relates to, for example, a technique effectively applied to a semiconductor device including a FINFET.

BACKGROUND ART

Japanese Patent Application Laid-Open Publication No. 2013-26594 (Patent Document 1) describes a technique related to a cell layout of an SRAM (Static Random Access Memory).

Japanese Patent Application Laid-Open Publication No. H11-111860 (Patent Document 2) describes a technique related to a semiconductor device including a memory cell, which can achieve a high-speed operation and high integration.

RELATED ART DOCUMENTS

Patent Documents

Patent Document 1: Japanese Patent Application Laid-Open Publication No. 2013-26594
Patent Document 2: Japanese Patent Application Laid-Open Publication No. H11-111860

SUMMARY OF THE INVENTION

Problems to be Solved by the Invention

For example, for an SRAM (Static Random Access Memory), a conventional planar type MISFET (Metal Insulator Semiconductor Field Effect Transistor) is used. In this SRAM, for example, a first wiring layer (contact wiring), a second wiring layer (bit line/power supply line), a third wiring layer (word line/power supply line), a fourth wiring layer (power supply line), and a fifth wiring layer (power supply line), which are arranged above the planar type MISFET, are formed.

In recent years, in an LSI (Large Scale Integration) using silicon, a dimension of the MISFET serving as its component, particularly a gate length of a gate electrode has steadily reduced. The downsizing of the MISFET has proceeded along a scaling law. However, various problems have appeared as the generation of a device has advanced, and it has been difficult to suppress a short channel effect of the MISFET and secure a high current driving power at the same time. Therefore, a device with a new structure as an alternative to the conventional planar type MISFET has been actively researched and developed.

A FINFET is one of the above-described devices with the new structure, and is an MISFET having a three-dimensional structure different from the planar type MISFET. In recent years, this FINFET has been paid attention to as an important device candidate.

The FINFET has a fin formed by processing a semiconductor layer. This fin is a region having a thin strip shape (rectangular parallelepiped shape), and both side surface portions of this fin are used as channels of the FINFET. A gate electrode of the FINFET is formed on both the side surfaces of the fin so as to bridge over the fin, and has a so-called double gate structure. According to the FINFET configured as described above, potential controllability over a channel region by the gate electrode is better than that of the conventional MISFET having a single gate structure. Therefore, the FINFET has an advantage in that a punch-through resistance between a source region and a drain region is high so that a short channel effect can be suppressed to a smaller gate length. Since both the side surfaces of the fin are used as the channels of the FINFET, the area of the channel region through which a current is caused to flow can be increased so that a high current driving power can be obtained. That is, according to the FINFET, it has been expected to achieve both the suppression of the short channel effect and the securement of the high current driving power at the same time.

When the FINFET is used, the FINFET can be more miniaturized than the planar type MISFET. Thus, a lowermost wiring layer can be formed in the same layer as the FINFET in a layer below a first wiring layer. Thus, an SRAM using the FINFET can be configured by a lowermost layer wiring (zero-th wiring layer), a first wiring layer (bit line/power supply line), a second wiring layer (word line/power supply line), a fourth wiring layer (power supply line), and a fifth wiring layer (power supply line). That is, in the SRAM using the FINFET, a space is formed in the third wiring layer. Therefore, the third wiring layer to be the space is desired to be effectively utilized.

Other object and novel characteristics will be apparent from the description of the present specification and the accompanying drawings.

Means for Solving the Problems

A semiconductor device according to one embodiment includes a FINFET including a gate electrode formed on a semiconductor substrate, and a lowermost wiring layer including a directly-above wiring in contact with the gate electrode and an on-substrate wiring formed on the semiconductor substrate. At this time, the directly-above wiring and the on-substrate wiring are electrically connected to each other in the lowermost wiring layer so that a wiring network can be formed. Thus, a space is formed in an upper wiring layer. This upper wiring layer to be the space is effectively utilized from the viewpoint of improving the performance of the semiconductor device.

Effects of the Invention

According to one embodiment, a performance of a semiconductor device can be improved.

BRIEF DESCRIPTIONS OF THE DRAWINGS

FIG. 5(a) is a table illustrating wiring layers used in an SRAM using the planar type FET, and FIG. 5(b) is a table illustrating wiring layers used in an SRAM using the FIN-FET;

FIG. 12(a) is a table illustrating wiring layers in a peripheral circuit of an SRAM using a planar type FET, FIG. 12(b) is a table illustrating wiring layers in a peripheral circuit of an SRAM using a FINFET, and FIG. 12(c) is a table illustrating wiring layers in a peripheral circuit of an SRAM using a FINFET when a basic idea in a second embodiment is adopted;

BEST MODE FOR CARRYING OUT THE INVENTION

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and others), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle.

Similarly, in the embodiments described below, when the shape of the components, positional relation thereof, and others are mentioned, the substantially approximate and similar shapes and others are included therein unless otherwise stated or except the case where it is conceivable that they are apparently excluded in principle. The same goes for the numerical value and the range described above.

Also, components having the same function are denoted by the same reference symbols throughout all the drawings for describing the embodiments, and the repetitive description thereof is omitted. Note that hatching is used in some cases even in a plan view so as to make the drawings easy to see.

First Embodiment

<Layout Configuration of Semiconductor Chip>

Figure 1:
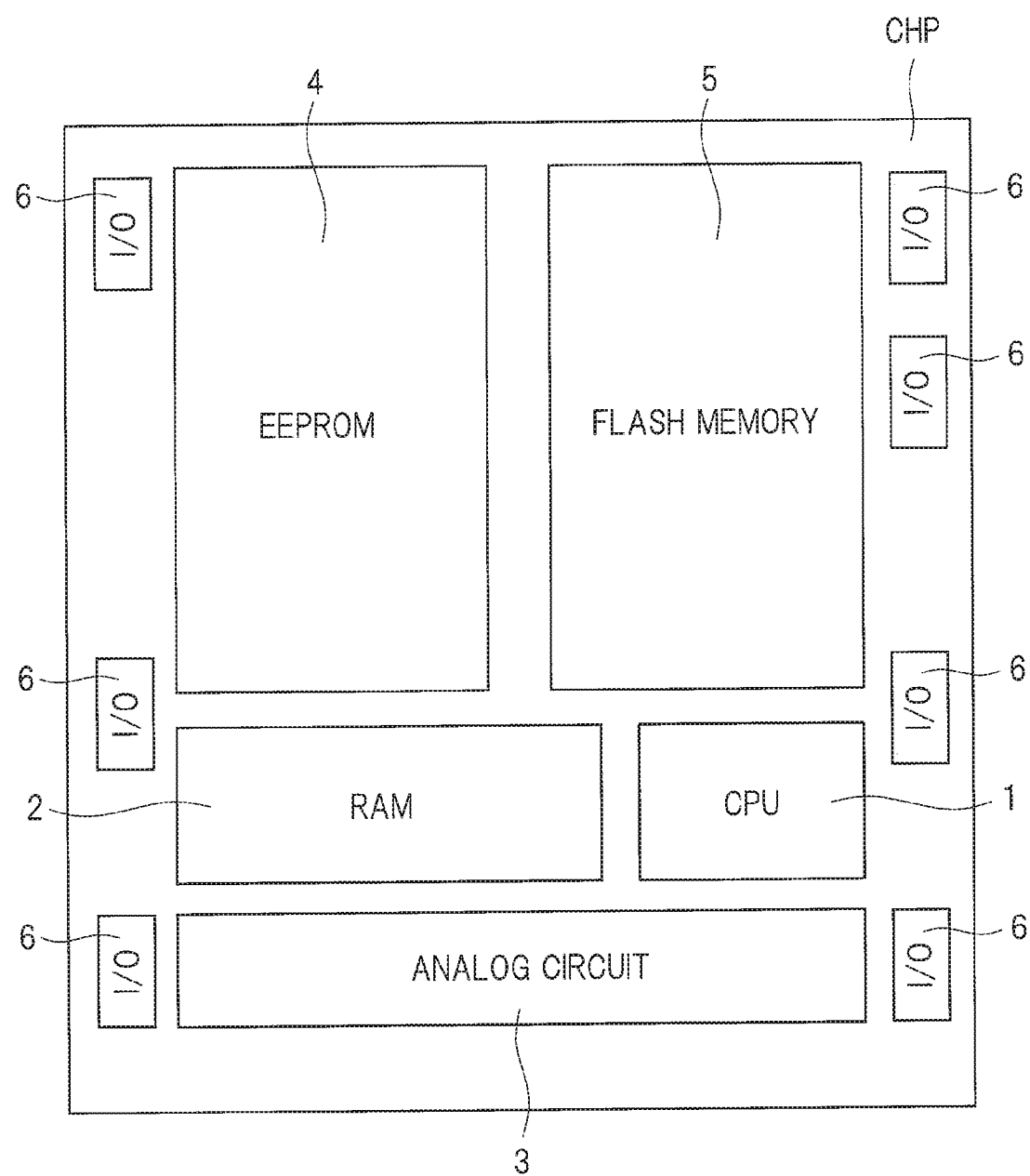
FIG. 1 is a diagram illustrating a layout configuration of a semiconductor chip.

A semiconductor device according to a first embodiment will be described with reference to the drawings. First, a layout configuration of a semiconductor chip in which a system including a microcomputer is formed will be described. FIG. 1 is a diagram illustrating a layout configuration of a semiconductor chip CHP in the present first embodiment. The semiconductor chip CHP includes a CPU (Central Processing Unit) 1, a RAM (Random Access Memory) 2, an analog circuit 3, an EEPROM (Electrically Erasable Programmable Read Only memory) 4, a flash memory 5, and an I/O (Input/Output) circuit 6.

The CPU (circuit) 1 is also referred to as a central processing unit, and corresponds to a core of a computer or others. This CPU 1 reads out and decodes an instruction from a storage device, and performs various calculations and controls based on the instruction.

The RAM (circuit) 2 is a memory capable of randomly reading out memory information, that is, reading out the stored memory information at any time and newly writing the memory information, and is also referred to as a randomly writable and readable memory. A RAM serving as an IC memory includes two types of a DRAM (Dynamic RAM) using a dynamic circuit and an SRAM (Static RAM) using a static circuit. The DRAM is a random access memory requiring a memory retaining operation, and the SRAM is a random access memory not requiring the memory retaining operation. In the present first embodiment, the RAM 2 is configured of the SRAM.

The analog circuit 3 is a circuit which handles a voltage signal or a current signal continuously temporally changing, i.e., an analog signal, and is configured of, for example, an amplification circuit, a conversion circuit, a modulation circuit, an oscillation circuit, a power supply circuit, and others.

Each of the EEPROM 4 and the flash memory 5 is one type of an electrically rewritable nonvolatile memory in both the writing operation and the erasing operation, and is also referred to as an electrically erasable programmable read-only memory. A memory cell in each of the EEPROM 4 and the flash memory 5 is configured of, for example, a MONOS (Metal Oxide Nitride Oxide Semiconductor)-type transistor or a MNOS (Metal Nitride Oxide Semiconductor)-type transistor for storage (memory). For the writing operation and the erasing operation of each of the EEPROM and the flash memory 5, for example, a Fowler-Nordheim tunneling phenomenon is used. Note that the writing operation and the erasing operation can also be performed by using hot electrons and hot holes. The EEPROM 4 and the flash memory 5 are different from each other in that the EEPROM 4 is, for example, a nonvolatile memory which is erasable in a unit of a byte while the flash memory 5 is, for example, a nonvolatile memory which is erasable in a unit of a word line. Generally, the flash memory 5 stores programs or others for causing the CPU 1 to execute various types of processing. On the other hand, the EEPROM 4 stores various types of data with a high rewriting frequency.

The I/O circuit 6 is an input/output circuit, and is a circuit for outputting data to a device connected to the outside of a semiconductor chip CHP from inside of the semiconductor chip CHP and inputting data from the device connected to the outside of the semiconductor chip CHP into the semiconductor chip.

A layout of the semiconductor chip CHP in the present first embodiment is configured as described above. The SRAM configuring the RAM 2 will be described below.

<Configuration of SRAM>

Figure 2:
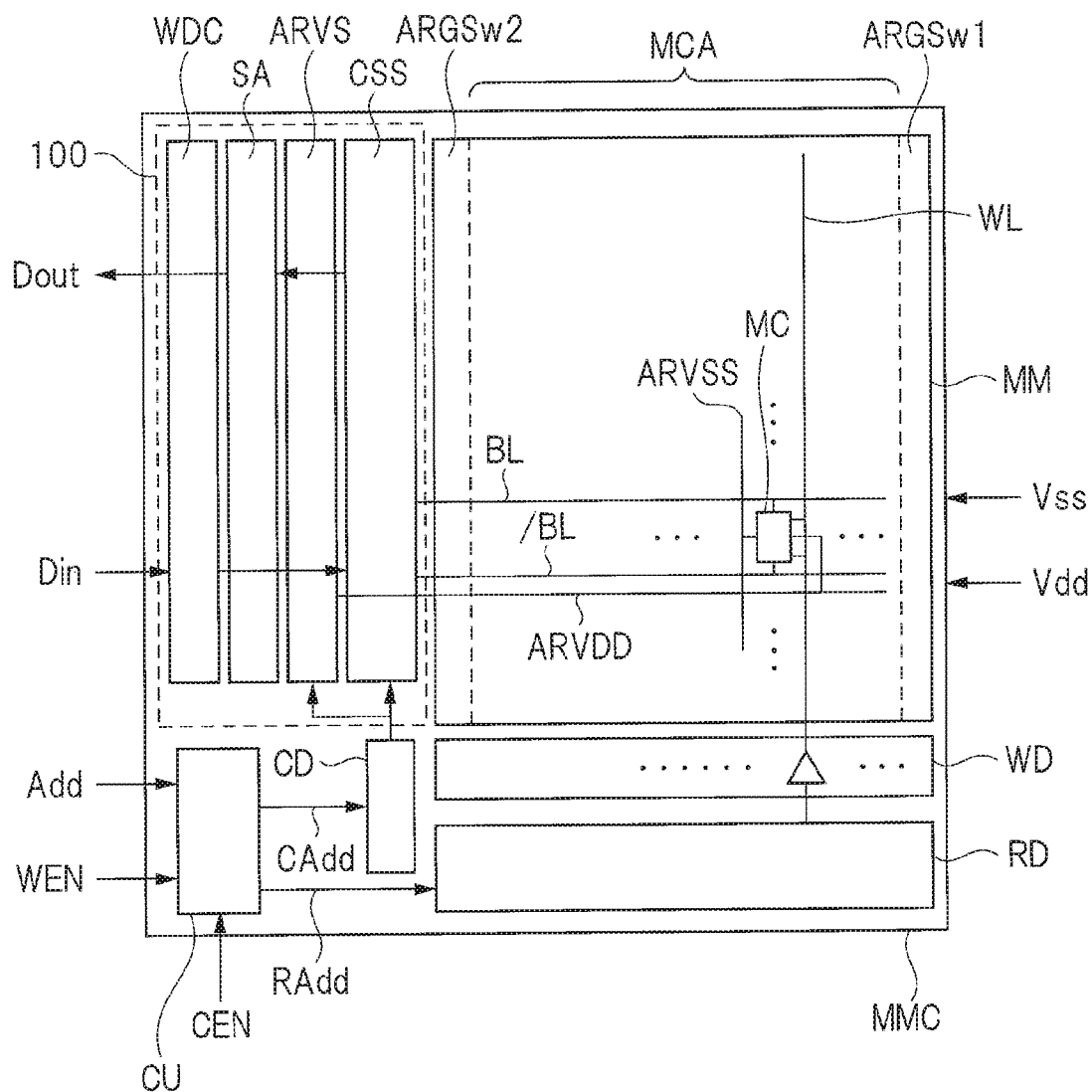
FIG. 2 is a plan block diagram schematically illustrating an entire configuration of an SRAM.

FIG. 2 is a plan block diagram schematically illustrating an entire configuration of the SRAM. The entire configuration of the SRAM illustrated in FIG. 2 will be described below. This SRAM includes a memory mat circuit MM, an I/O circuit (input/output circuit) 100, a word driver WD, a row decoder RD, a control circuit unit CU, a column decoder CD, a word line WL, a bit line BL and a complementary bit line /BL configuring a bit line pair, a cell power supply line ARVDD, and a local ground line ARVSS. Here, it is desired to provide a plurality of the bit line pairs (BL, /BL), a plurality of the cell power supply lines ARVDD, and a plurality of the local ground lines ARVSS.

The memory mat circuit MM includes a memory cell array MCA-A ground line switch circuit ARGSw1, and a ground line switch circuit ARGSw2. The memory cell array MCA includes a plurality of memory cells MC arranged in a longitudinal and lateral array.

The I/O circuit 100 includes a column selection switch circuit CSS, a cell power supply voltage line control circuit ARVC, a sense amplifier circuit SA-And a write driver circuit WDC.

Next, a connection relation among components in the SRAM illustrated in FIG. 2 will be described. The cell power supply voltage line control circuit ARVC and the memory cell MC are connected to each other via the cell power supply line ARVDD. Here, the plurality of memory cells MC arranged in a lateral direction in FIG. 2 are connected to, for example, the same cell power supply line ARVDD. The plurality of memory cells MC arranged in a longitudinal direction in FIG. 2 are grounded via the same local ground line ARVSS.

The column selection switch circuit CSS and the memory cell MC are connected to each other via the bit line pair (BL, /BL). Here, for example, the plurality of memory cells MC arranged in the lateral direction in FIG. 2 are connected to each other via the same bit line BL, and besides, via the same complementary bit line /BL.

The word driver WD and the memory cell MC are connected to each other via the word line WL. Here, for example, the plurality of memory cells MC arranged in the longitudinal direction in FIG. 2 are connected to the same word line WL.

Then, an operation of the SRAM illustrated in FIG. 2 will be described. A chip enable signal CEN, a write enable signal WEN, and an address signal Add are input to the control circuit unit CU. When the chip enable signal CEN is inactive, the control circuit unit CU is turned off. When the chip enable signal CEN is active, the control circuit unit CU is turned on so that a read operation and a write operation on the SRAM are performed.

If the write enable signal WEN issues an instruction to write the data, the control circuit unit CU activates the write driver circuit WDC. The write driver circuit WDC is activated at the time of the write operation so as to transfer an input data signal Din to the column selection switch circuit CSS. The write driver circuit WDC is inactive in a case other than the time of the write operation.

If the write enable signal WEN issues an instruction to read the data, the control circuit unit CU activates the sense amplifier circuit SA. The sense amplifier circuit SA is activated at the time of the read operation so as to amplify a weak reading data signal transferred from the column selection switch circuit CSS to generate an output data signal Dout. The sense amplifier circuit SA is inactivate in a case other than the time of the read operation.

The control circuit unit CU generates a row address RAdd and a column address CAdd based on the address signal Add.

The row decoder RD to which the row address RAdd has been input decodes the row address, and controls the word driver WD based on a result of the decoding. The word driver WD includes a plurality of word drivers corresponding to a plurality of rows, respectively. The word driver corresponding to the row represented by the decoding result of the row address RAdd is activated, so that the corresponding word line WL is driven.

The column decoder CD to which the column address CAdd has been input decodes the column address, and controls the column selection switch circuit CSS and the cell power supply voltage line control circuit ARVC based on a result of the decoding.

The column selection switch circuit CSS selects the bit line pair (BL, /BL) corresponding to the column address CAdd among the plurality of bit line pairs (BL, /BL) corresponding to the plurality of columns, respectively. The selected bit line pair (BL, /BL) is connected to the sense amplifier circuit SA at the time of the read operation, and is connected to the write driver circuit WDC at the time of the write operation. Note that the selected bit line pair (BL, /BL) is charged to a level of an external power supply voltage Vdd by a bit line pre-charge circuit that is not illustrated before the read operation or the write operation is performed.

For each column, the cell power supply voltage line control circuit ARVC controls a voltage level of the cell power supply line ARVDD provided for the column. At the time of the write operation, the cell power supply voltage line control circuit ARVC reduces a voltage of the cell power supply line ARVDD in the selected column from a level of the external power supply voltage Vdd and maintains a voltage of the cell power supply line ARVDD in the other column at the level of the external power supply voltage Vdd. At the time of the read operation and the time of standby, the cell power supply voltage line control circuit ARVC maintains respective voltages of all the cell power supply lines ARVDD at the level of the external power supply voltage Vdd.

<Configuration of Memory Cell in SRAM>

Figure 3:
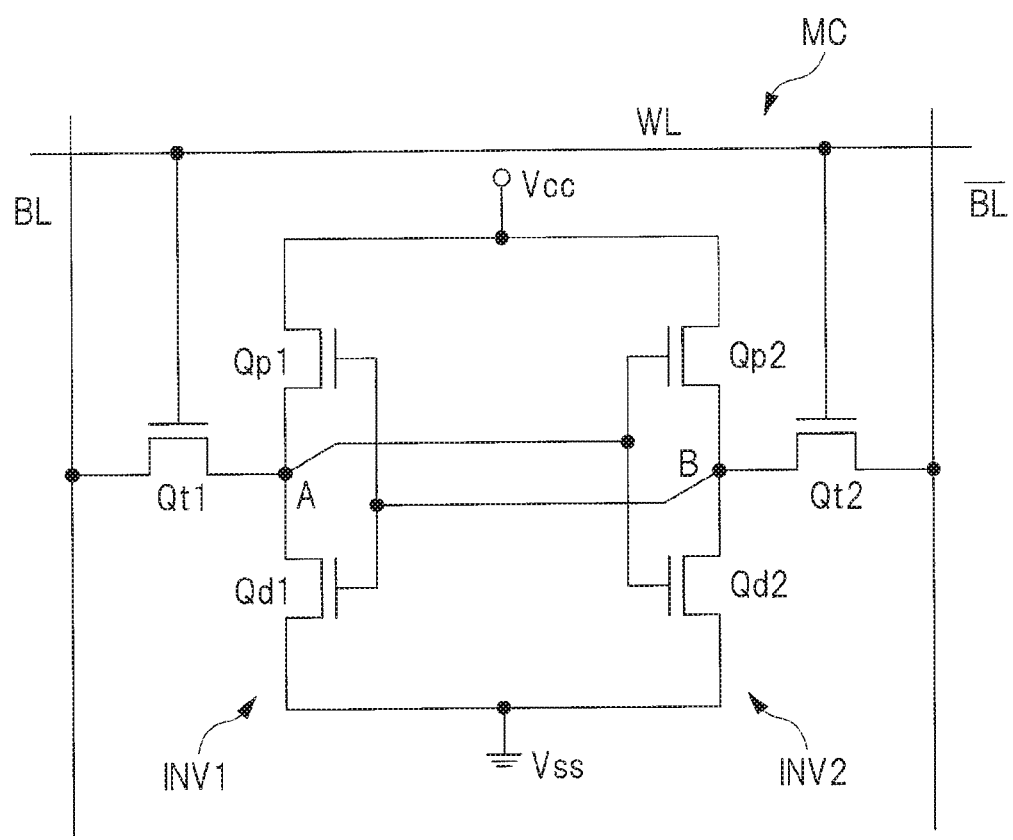
FIG. 3 is an equivalent circuit diagram illustrating a memory cell in the SRAM.

Next, an equivalent circuit of the memory cell MC configuring the SRAM will be described. FIG. 3 is an equivalent circuit diagram illustrating the memory cell MC in the SRAM in the present first embodiment. As illustrated in FIG. 3, this memory cell MC is arranged at an intersection between a pair of complementary bit lines (bit line BL, bit line /BL) and a word line WL, and is configured of a pair of driving MISFETs (Qd1, Qd2), a pair of load MISFET (Qp1, Qp2), and a pair of transfer MISFETs (Qt1, Qt2). Each of the driving MISFETs (Qd1, Qd2) and the transfer MISFETs (Qt1, Qt2) is configured of an n-channel MISFET, and each of the load MISFETs (Qp1, Qp2) is configured of a p-channel MISFET.

Among the above-described six MISFETs configuring the memory cell MC, the driving MISFET Qd1 and the load MISFET Qp1 configure a CMOS inverter INV1, and the driving MISFET Qd2 and the load MISFET Qp2 configure a CMOS inverter INV2. Respective mutual input/output terminals (storage nodes A and B) of the pair of CMOS inverters INV1 and INV2 are cross-linked to each other, and configure a flip-flop circuit serving as an information storage unit storing 1-bit information. One input/output terminal (the storage node A) of the flip-flop circuit is connected to either one of a source region and a drain region of the transfer MISFET Qt1, and the other input/output terminal (the storage node B) of the same is connected to either one of a source region and a drain region of the transfer MISFET Qt2.

Furthermore, the other of the source region and the drain region of the transfer MISFET Qt1 is connected to the bit line BL, and the other of the source region and the drain region of the transfer MISFET Qt2 is connected to the bit line /BL. One end of the flip-flop circuit (each source region of the load MISFETs Qp1 and Qp2) is connected to a power supply voltage (Vcc), and the other end thereof (each source region of the driving MISFETs Qd1 and Qd2) is connected to a reference voltage (Vss).

In explanation of an operation of the above-described circuit, when the storage node A of one CMOS inverter INV1 is at a high potential ("H"), the driving MISFET Qd2 is turned on. Thus, the storage node B of the other CMOS inverter INV2 is at a low potential ("L"). Therefore, the driving MISFET Qd1 is turned off, and the high potential ("H") of the storage node A is maintained. That is, by a latch circuit obtained by cross-linking the pair of CMOS inverters INV1 and INV2, states of the mutual storage nodes A and B are maintained, so that information is stored during application of the power supply voltage.

The word line WL is connected to respective gate electrodes of the transfer MISFETs Qt1 and Qt2, and conduction and non-conduction of the transfer MISFETs Qt1 and Qt2 are controlled by this word line WL. That is, when the word line WL is at a high potential ("H"), the transfer MISFETs Qt1 and Qt2 are turned on, and the latch circuit and the complementary bit lines (bit line BL, bit line /BL) are electrically connected to each other. Thus, each potential state ("H" or "L") of the storage nodes A and B appear on the bit lines DL and /DL, and are read as information of the memory cell MC.

In order to write information into the memory cell MC, the word line WL is brought into an "H" potential level, and the transfer MISFETs Qt1 and Qt2 are turned on, so that information of the bit lines BL and /BL is transferred to the storage nodes A and B. As described above, the SRAM can be operated.

<Basic Idea in First Embodiment>

Figure 4:
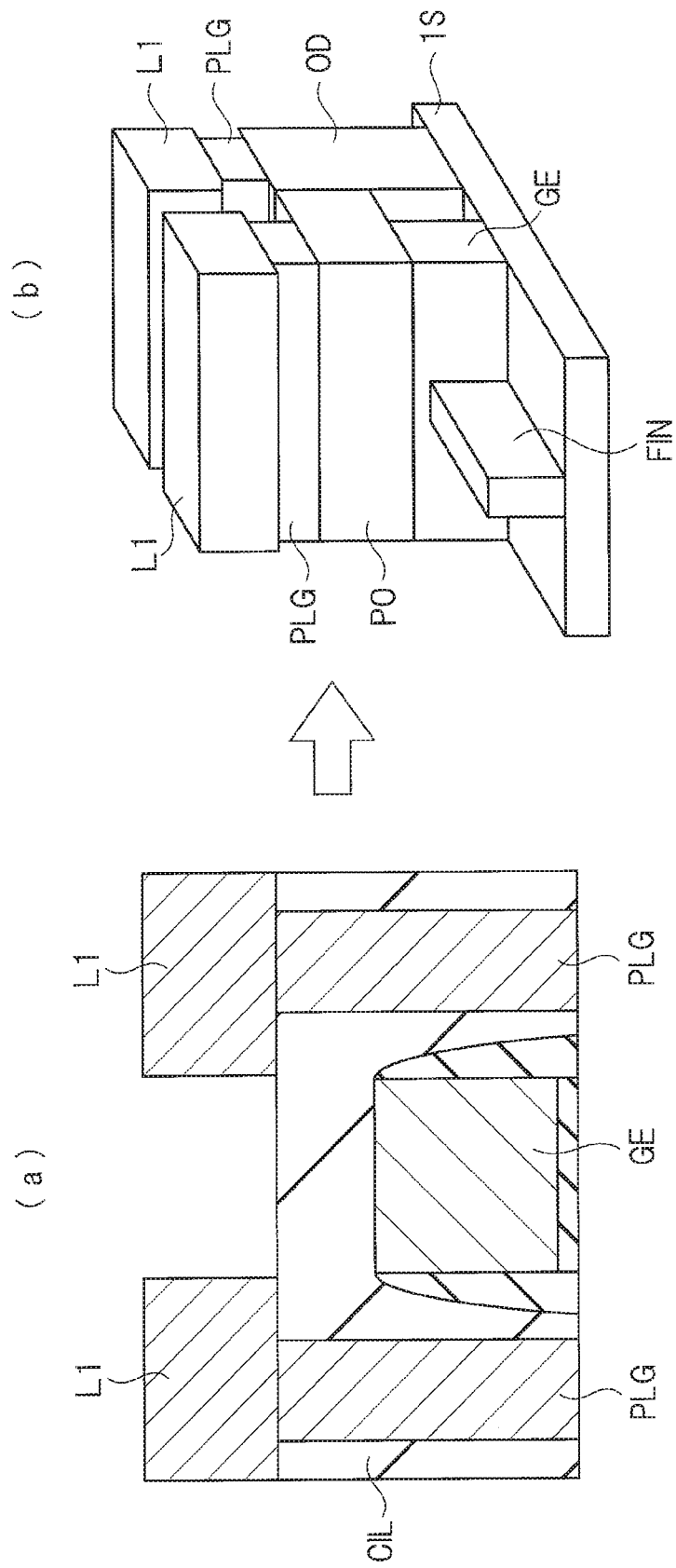
FIG. 4(*a*) is a cross-sectional view illustrating a schematic structure of a planar type FET, and FIG. 4(*b*) is a cross-sectional view illustrating a schematic structure of a FINFET.

Then, a basic idea in the present first embodiment will be described. FIG. 4 is a diagram explaining the basic idea in the present first embodiment. FIG. 4(a) is a cross-sectional view illustrating a schematic structure of a planar type FET, and FIG. 4(b) is a cross-sectional view illustrating a schematic structure of an FINFET.

First, as illustrated in FIG. 4(a), in the planar type FET, a gate electrode GE is formed on a semiconductor substrate via a gate insulating film, and a contact interlayer insulating film CIL is formed to cover this gate electrode GE. A plug PLG, which penetrates the contact interlayer insulating film CIL, is formed in the contact interlayer insulating film CIL, and the plug PLG is connected to a wiring L1 arranged on the contact interlayer insulating film CIL. In a semiconductor device including the planar type FET configured as described above, no wiring is formed in the contact interlayer insulating film CIL. Therefore, in the semiconductor device including the planar type FET, a lowermost wiring layer is a first wiring layer including the wiring L1 arranged on the contact interlayer insulating film CIL.

On the other hand, in FIG. 4(b), the FINFET includes a fin FIN formed on a semiconductor substrate 1S. This fin is a region having a thin strip shape (rectangular parallelepiped shape), and both side surface portions of this fin are used as channels of the FINFET. A gate electrode GE of the FINFET is formed on both the side surfaces of the fin FIN so as to bridge over the fin FIN, and has a so-called double gate structure. According to the FINFET configured as described above, potential controllability over a channel region by the gate electrode GE is better than that of the conventional MISFET having a single gate structure (planar structure). Therefore, the FINFET has an advantage in that a punch-through resistance between a source region and a drain region is high so that a short channel effect can be suppressed to a smaller gate length. Since both the side surfaces of the fin FIN are used as the channels of the FINFET, the area of the channel region through which a current is caused to flow can be increased so that a high current driving power can be obtained. That is, according to the FINFET, both the suppression of the short channel effect and the securement of the high current driving power can be achieved at the same time.

In the FINFET configured as described above, the gate electrode GE is more miniaturized than that in the planar type FET. Thus, a directly-above wiring PO in contact with the gate electrode GE can be formed in a contact interlayer insulating film, and an on-substrate wiring OD can be provided on the semiconductor substrate 1S. In a semiconductor device including the FINFET, the directly-above wiring PO and the on-substrate wiring OD can be electrically connected to each other inside the contact interlayer insulating film in response to the miniaturization in the FINFET. That is, in a semiconductor device including the FINFET, a wiring network including the directly-above wiring PO and the on-substrate wiring OD can be formed inside the contact interlayer insulating film. As illustrated in FIG. 4(b), each of the directly-above wiring PO and the on-substrate wiring OD is electrically connected to the wiring L1 via the plug PLG.

Thus, in the semiconductor device including the FINFET, the wiring network including the directly-above wiring PO and the on-substrate wiring OD formed inside the contact interlayer insulating film becomes the lowermost wiring layer. That is, in the semiconductor device including the FINFET, the lowermost wiring layer is a zero-th wiring layer including the directly-above wiring PO and the on-substrate wiring OD formed inside the contact interlayer insulating film.

As described above, the FINFET is more miniaturized than the planar type FET. Thus, in the semiconductor device including the FINFET, the wiring network including the directly-above wiring PO and the on-substrate wiring OD can be provided as a zero-th wiring layer inside the contact interlayer insulating film. The basic idea in the present first embodiment is based on the fact that the zero-th wiring layer can be provided in the semiconductor device including the FINFET.

This fact will be described below. FIG. 5(a) is a table illustrating wiring layers used in an SRAM using a planar type FET. As illustrated in FIG. 5(a), in the SRAM using the planar type FET, a zero-th wiring layer (M0) cannot be provided. Thus, a first wiring layer (M1) to a fifth wiring layer (M5) are used. More specifically, a contact wiring is arranged in the first wiring layer (M1), and a bit line and a power supply line are arranged in the second wiring layer (M2). A word line and a power supply line are arranged in the third wiring layer (M3), and a power supply line is arranged in each of the fourth wiring layer (M4) and the fifth wiring layer (M5).

On the other hand, FIG. 5(b) is a table illustrating wiring layers used in an SRAM using a FINFET. As illustrated in FIG. 5(b), in the SRAM using the FINFET, a zero-th wiring layer (M0) can be provided. Thus, the zero-th wiring layer (M0) to a fifth wiring layer (M5) are used. More specifically, a contact wiring is arranged in the zero-th wiring layer (M0), and a bit line and a power supply line are arranged in the first wiring layer (M1). A word line and a power supply line are arranged in the second wiring layer (M2), and a power supply line is arranged in each of the fourth wiring layer (M4) and the fifth wiring layer (M5). Therefore, in the SRAM using the FINFET, the zero-th wiring layer can be provided by the miniaturization of the FINFET. Thus, as illustrated in FIG. 5(b), for example, the third wiring layer (M3) is not used. In other words, in the SRAM using the FINFET, a space is created in the third wiring layer (M3).

The basic idea in the present first embodiment lies in the point that this space is effectively utilized. That is, the basic idea in the present first embodiment is an idea to attempt to effectively utilize the space created in the third wiring layer (M3) by the zero-th wiring layer (M0) which can exist by the miniaturization of the FINFET. That is, the basic idea in the present embodiment is an idea to effectively utilize the third wiring layer not required as the wiring layer configuring the SRAM, and particularly utilizes the space created in the third wiring layer from the viewpoint of improving the performance of the semiconductor device.

An example of embodying the basic idea in the present first embodiment will be described below. More specifically, an example of a configuration effectively utilizing the space created in the third wiring layer will be described from the viewpoint of improving the performance of the semiconductor device based on a new knowledge found out by the present inventors.

<Study on Improvement>

Figure 6:
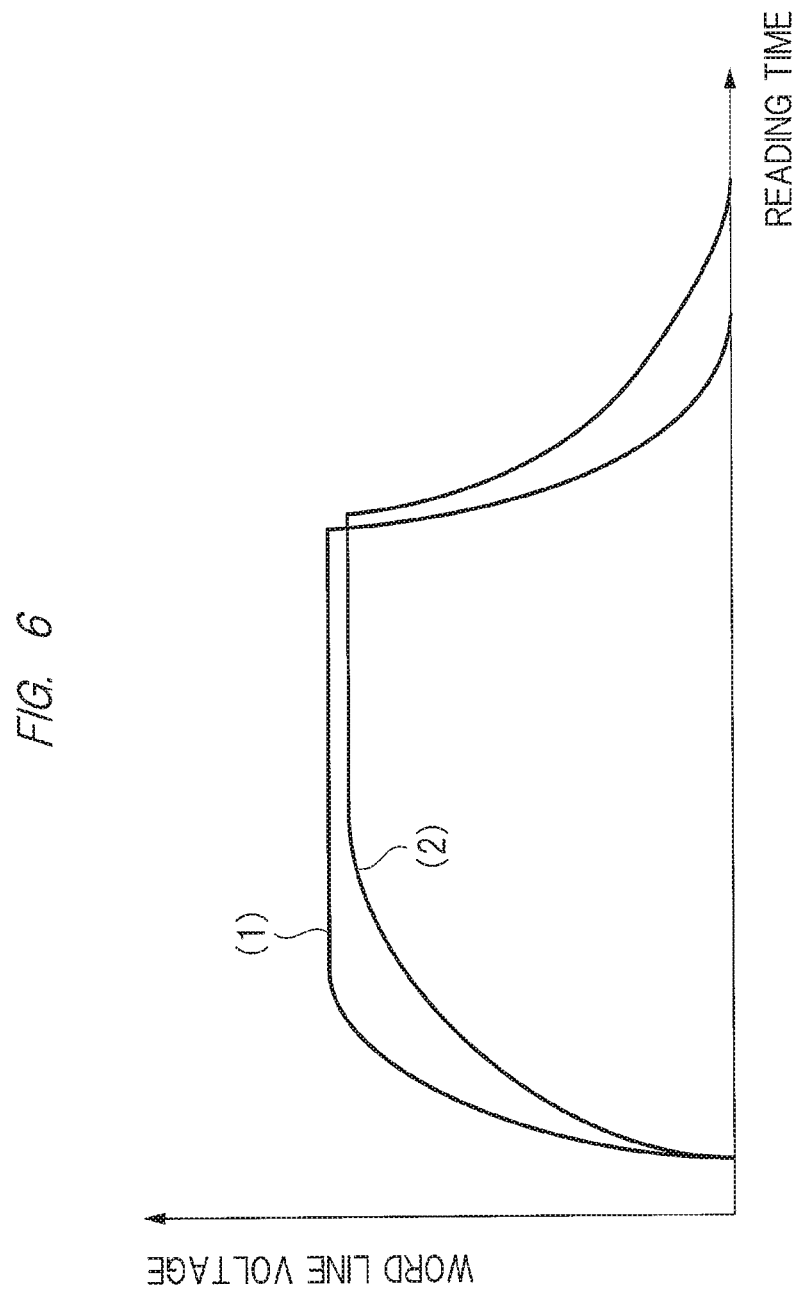
FIG. 6 is a waveform diagram illustrating a relation between a word line voltage at the time of reading and a reading time in the SRAM.

In the SRAM using the FINFET, a high-speed operation is desired. Here, FIG. 6 is a waveform diagram illustrating a relation between a word line voltage at the time of reading and a reading time in the SRAM. In FIG. 6, a term (1) indicates a waveform in a memory cell arranged in a near end of a word driver, and a term (2) indicates a waveform in a memory cell arranged at a far end of the word driver. As illustrated in FIG. 6, it is found that it takes more time to raise the word line voltage in the memory cell arranged at the far end of the word driver than the memory cell arranged at the near end of the word driver. Thus, it is required to delay the read timing in order to sufficiently ensure a bit line potential difference, and this requirement becomes a factor for inhibiting the high-speed operation in the SRAM.

Regarding this point, the present inventors have studied enhancement of the driving performance of the transistor configuring the word driver first in order to resolve the inhibiting factor. However, this measure does not lead to the improvement in the waveform of the word line voltage. Therefore, as a result of earnest studies by the present inventors, it has been found out that the wiring resistance of the word line affects the waveform distortion. That is, the present inventors have obtained such new knowledge that the rising time of the word line voltage is largely influenced by the wiring resistance of the word line. Therefore, based on the newly-found knowledge, the present inventors have found out such directionality that the waveform distortion of the word line voltage can be resolved if the resistance of the word line can be decreased, which results in the achievement of the high-speed operation in the SRAM. Therefore, in the present first embodiment, based on such new knowledge that the operation speed in the SRAM can be increased by the decrease in the word line resistance, a device to effectively utilize the space created in the third wiring layer is performed in order to decrease the resistance of the word line. A technical idea in the present first embodiment to which the device has been performed will be described below.

<Planar Layout Configuration of Memory Cell>

Figure 7:
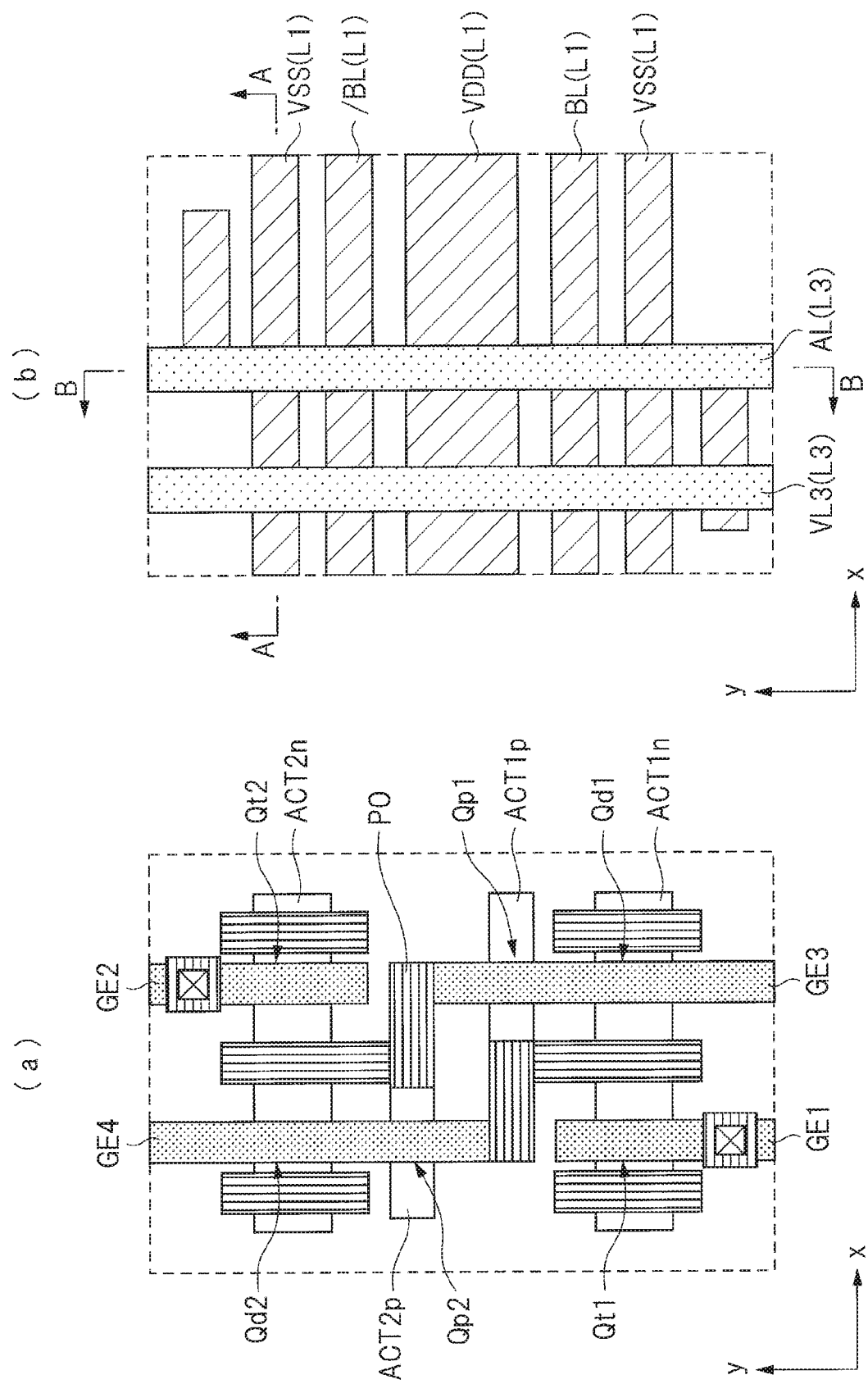
FIG. 7(a) is a plan view illustrating a layout configuration of the inside of a semiconductor substrate and a zero-th wiring layer.
FIG. 7(b) is a plan view illustrating a layout configuration of a first wiring layer to a third wiring layer.

FIG. 7 is a plan view illustrating a planar layout configuration of a memory cell in the SRAM in the present first embodiment. Particularly, FIG. 7(a) is a plan view illustrating a layout configuration of inside of a semiconductor substrate and a zero-th wiring layer, and FIG. 7(b) is a plan view illustrating a layout configuration of a first wiring layer to a third wiring layer. Note that the memory cell in the SRAM also has a fourth wiring layer and a fifth wiring layer. However, these wiring layers have small relevance to the technical idea in the present first embodiment, and therefore, description in the following specification and illustration in the following drawings of the wiring layers are omitted.

As illustrated in FIG. 7(a), the memory cell in the SRAM is configured of, for example, six transistors (FINFETs), i.e., a pair of driving MISFETs (Qd1, Qd2), a pair of load MISFETs (Qp1, Qp2), and a pair of transfer MISFETs (Qt1, Qt2) formed in the semiconductor substrate. At this time, each of the pair of driving MISFETs (Qd1, Qd2) and the pair of transfer MISFETs (Qt1, Qt2) is configured of an n-channel MISFET, and each of the pair of load MISFETs (Qp1, Qp2) is configured of a p-channel MISFET.

As illustrated in FIG. 7(a), an element isolation region is formed in the semiconductor substrate, and active regions ACT1n, ACT1p, an ACT2n, and an ACT2p are partitioned by the element isolation region. More specifically, the active region ACT1n partitioned by the element isolation region is formed to extend in an x-direction, and the active region ACT1p is formed to extend in the x-direction next to this active region ACT1n via the element isolation region. The active region ACT2p is formed to extend in the x-direction next to the active region ACT1p via the element isolation region. Further, the active region ACT2n is formed to extend in the x-direction next to the active region ACT2p via the element isolation region. Thus, in the SRAM, as illustrated in FIG. 7(*a*), the active regions ACT1*n*, ACT1*p*, ACT2*p*, and ACT2*n* are formed to line in a y-direction via the element isolation region therebetween, and the active regions ACT1*n*, ACT1*p*, ACT2*p*, and ACT2*n* are formed to extend in the x-direction.

Each of the active regions ACT1*n* and ACT2*n* is a semiconductor region where n-type impurities such as phosphorous or arsenic are introduced into the semiconductor substrate, and each of the active regions ACT1*p* and ACT2*p* is a semiconductor region where p-type impurities such as boron are introduced into the semiconductor substrate.

First, when the active region ACT1*n* is paid attention to, a gate electrode GE1 and a gate electrode GE3 are formed to stereoscopically intersect the active region ACT1*n* extending in the x-direction. That is, the gate electrode GE1 and the gate electrode GE3 are arranged so as to be in parallel to each other and extend in the y-direction. At this time, the transfer MISFET Qt1 is formed by the gate electrode GE1 and the active region ACT1*n* formed on both sides of the gate electrode GE1. In this transfer MISFET Qt1, the active region ACT1*n* formed on both sides of the gate electrode GE1 becomes a source region or a drain region, and an on-substrate wiring OD is arranged on the active region ACT1*n* to be the source region or the drain region.

On the other hand, the gate electrode GE1 in the transfer MISFET Qt1 extends from the upper portion of the active region ACT1*n* to the upper portion of the element isolation region.

Furthermore, when the active region ACT1*n* in the memory cell is paid attention to, the driving MISFET Qd1 is formed by the gate electrode GE3 and the active region ACT1*n* formed on both sides of the gate electrode GE3. In this driving MISFET Qd1, the active region ACT1*n* formed on both sides of the gate electrode GE3 becomes a source region or a drain region, and the on-substrate wiring OD is arranged on the active region ACT1*n* to be the source region or the drain region. Thus, in the active region ACT1*n*, the transfer MISFET Qt1 and the driving MISFET Qd1 are formed.

Subsequently, when the active region ACT1*p* is paid attention to, the gate electrode GE3 is formed to stereoscopically intersect the active region ACT1*p* extending in the x-direction. That is, the gate electrode GE3 arranged on the active region ACT1*n* is further formed so as to extend to the upper portion of the active region ACT1*p* in the y-direction. The load MISFET Qp1 is formed by the gate electrode GE3 and the active region ACT1*p* formed on both sides of the gate electrode GE3. Therefore, it is found that the gate electrode GE3 functions as a gate electrode of the driving MISFET Qd1 in a relation with the active region ACT1*n* and functions as a gate electrode of the load MISFET Qp1 in a relation with the active region ACT1*p*.

In the load MISFET Qp1, the on-substrate wiring OD is arranged on the active region ACT1*p* formed on one side of the gate electrode GE3. Inside the memory cell, an end of the gate electrode GE4 is arranged at a position close to a left end of the active region ACT1*p*. A directly-above wiring PO in contact with the upper portion of the gate electrode GE4 is formed, and the directly-above wiring PO and the on-substrate wiring OD arranged on the active region ACT1*p* are connected to each other.

Next, when the active region ACT2*p* is paid attention to, the gate electrode GE4 is formed to stereoscopically intersect the active region ACT2*p* extending in the x-direction. This gate electrode GE4 is arranged close to the left end of the active region ACT1*p* and is formed to stereoscopically intersect the active region ACT2*p* so as to extend in the y-direction. The load MISFET Qp2 is formed by the gate electrode GE4 and the active region ACT2*p* formed on both sides of the gate electrode GE4.

In the load MISFET Qp2, the on-substrate wiring OD is formed on the active region ACT2*p* formed on one side of the gate electrode GE4, and the on-substrate wiring OD and the directly-above wiring PO are connected to each other. The directly-above wiring PO is arranged to contact the upper portion of the gate electrode GE3.

Further, when the active region ACT2*n* is paid attention to, a gate electrode GE4 and a gate electrode GE2 are formed to stereoscopically intersect the active region ACT2*n* extending in the x-direction. That is, the gate electrode GE4 and the gate electrode GE2 are arranged so as to be in parallel to each other and extend in the y-direction. At this time, the driving MISFET Qd2 is formed by the gate electrode GE4 and the active region ACT2*n* formed on both sides of the gate electrode GE4. In this driving MISFET Qd2, the active region ACT12*n* formed on both sides of the gate electrode GE4 becomes a source region or a drain region, and an on-substrate wiring OD is arranged on the active region ACT2*n* to be the source region or the drain region. At this time, the gate electrode GE4 extends in the y-direction while its one end is arranged at a position close to the left end of the active region ACT1*p*, and extends to stereoscopically intersect both the active region ACT2*p* and the active region ACT2*n*. Therefore, one end of the gate electrode GE4 is connected to the directly-above wiring PO. It is found that the gate electrode GE4 functions as a gate electrode of the load MISFET Qp2 in a relation with the active region ACT2*p* and functions as a gate electrode of the driving MISFET Qd2 in a relation with the active region ACT2*n*.

Meanwhile, the transfer MISFET Qt2 is formed by the gate electrode GE2 and the active region ACT2*n* formed on both sides of the gate electrode GE2. In this transfer MISFET Qt2, the active region ACT2*n* formed on both sides of the gate electrode GE2 becomes a source region or a drain region, and the on-substrate wiring OD is arranged on the active region ACT2*n* to be the source region or the drain region. The gate electrode GE2 in the transfer MISFET Qt2 extends from the upper portion of the active region ACT2*n* to the upper portion of the element isolation region. As described above, the layout of the inside of the semiconductor substrate and the zero-th wiring layer is made.

Subsequently, a layout configuration of the first wiring layer to the third wiring layer will be described with reference to FIG. 7(*b*). As illustrated in FIG. 7(*b*), a plurality of wirings L1 arranged in the first wiring layer includes, for example, a power supply line VSS, a power supply line VDD, a bit line BL, and a complementary bit line /BL. Each of these wirings extends in the x-direction while being arranged to line in the y-direction. As illustrated in FIG. 7(*b*), a wiring L3 arranged in the third wiring layer includes an auxiliary line AL and a power supply line VL. These wirings extend in the y-direction, respectively, while being arranged side by side in the x-direction. In FIG. 7(*b*), note that the wiring arranged in the second wiring layer is arranged to overlap the wiring L3 arranged in the third wiring layer, and therefore, is not illustrated in FIG. 7(*b*). As described above, the layout of the first wiring layer to the third wiring layer is made.

<Cross-Sectional Configuration of Memory Cell>

Figure 8:
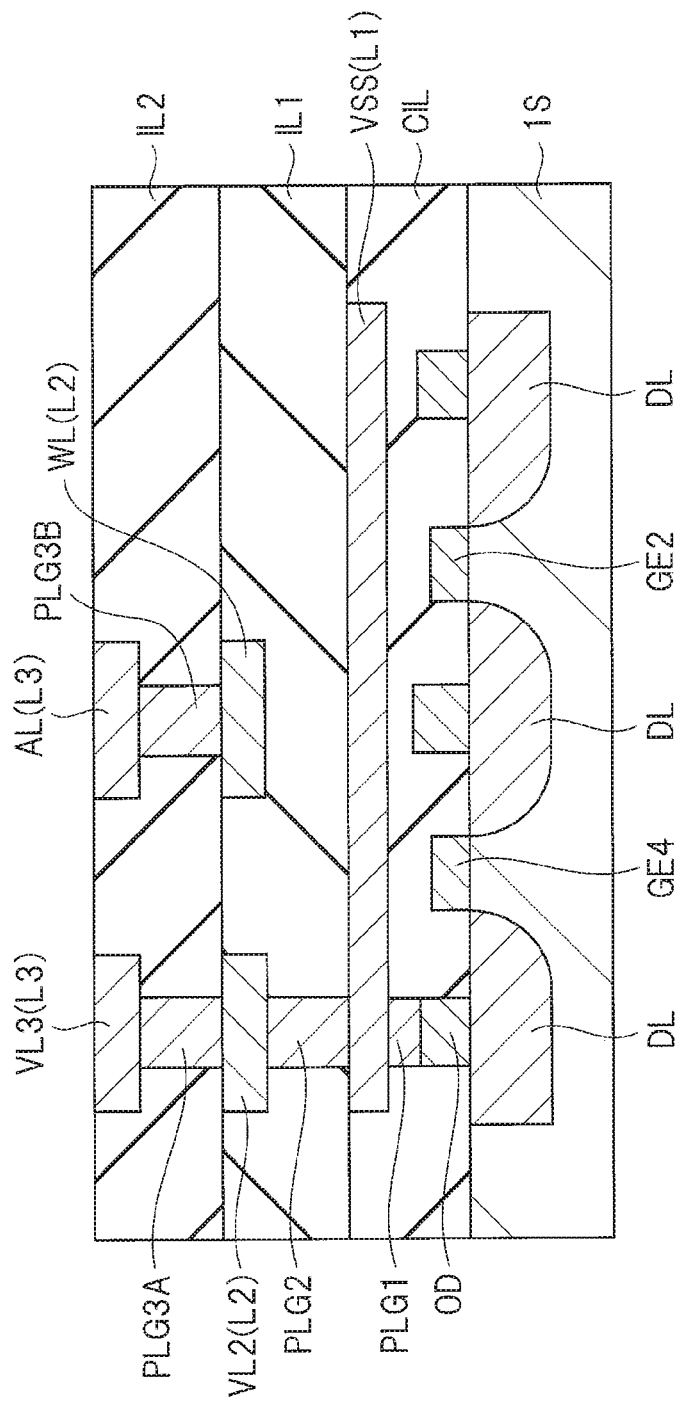
FIG. 8 is a cross-sectional view cut along a line A-A illustrated in FIG. 7(b)

Next, FIG. 8 is a cross-sectional view cut along a line A-A illustrated in FIG. 7(*b*). In FIG. 8, the gate electrode GE2, the gate electrode GE4, and the on-substrate wiring OD are arranged on a semiconductor substrate 1S, and a contact interlayer insulating film CIL is formed to cover the gate electrode GE2, the gate electrode GE4, and the on-substrate wiring OD. Meanwhile, inside the semiconductor substrate, a diffusion layer DL is formed. A plug PLG1 and the power supply line VSS are formed in the contact interlayer insulating film CIL, and, for example, the on-substrate wiring OD and the power supply line VSS are electrically connected to each other by the plug PLG1. Subsequently, the interlayer insulating film IL1 is formed on the contact interlayer insulating film CIL including the upper portion of the power supply line VSS. A plug PLG2, a power supply line VL2, and a word line WL are formed in the interlayer insulating film IL1. At this time, the power supply line VSS and the power supply line VL2 are electrically connected to each other by the plug PLG2.

Next, an interlayer insulating film IL2 is formed on the interlayer insulating film IL1 including the upper portion of the power supply line VL2 and the upper portion of the word line WL. The power supply line VL3, the auxiliary line AL, a plug PLG3A and a plug PLG3B are formed in the interlayer insulating film IL2. The power supply line VL2 and the power supply line VL3 are electrically connected to each other by the plug PLG3, and the word line WL and the auxiliary line AL are electrically connected to each other via the plug PLG3B.

Figure 9:
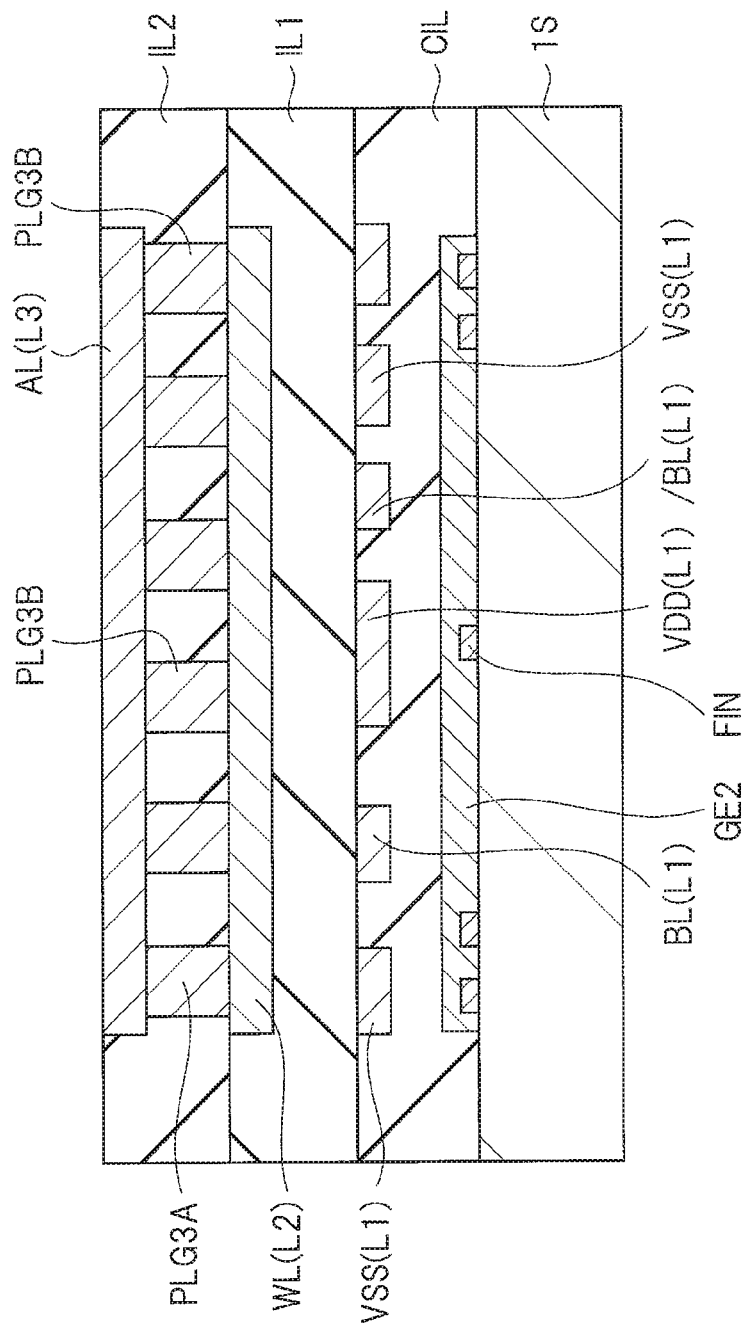
FIG. 9 is a cross-sectional view cut along a line B-B illustrated in FIG. 7(b)

FIG. 9 is a cross-sectional view cut along a line B-B illustrated in FIG. 7(b). As illustrated in FIG. 9, fins FIN and the gate electrode GE2 are formed on the semiconductor substrate 1S, and a contact interlayer insulating film CIL is formed to cover the gate electrode GE2. The plurality of wirings L1 are formed in the contact interlayer insulating film CIL, and the plurality of wirings L1 include the power supply line VSS, the bit line BL, the complementary bit line /BL, and the power supply line VDD.

Subsequently, an interlayer insulating film IL1 is formed on the contact interlayer insulating film CIL including the respective upper portions of the plurality of wirings L1, and the word line WL is formed in the interlayer insulating film IL1. An interlayer insulating film IL2 is formed on the interlayer insulating film IL1 including the upper portion of the word line WL, and the plurality of plugs PLG3B and the auxiliary line AL are formed in the interlayer insulating film IL2. At this time, the word line WL and the auxiliary line AL are electrically connected to each other by the plurality of plugs PLG3B. Similarly, although not illustrated in FIG. 9, for example, the power supply line VL2 and the power supply lines VL3 illustrated in FIG. 8 are connected to each other by the plurality of plugs PLG3A.

As described above, the memory cell in the present first embodiment is configured. That is, the semiconductor device in the present first embodiment includes a memory cell formation region where a memory cell storing information is formed. At this time, in the memory cell formation region, the semiconductor substrate, the FINFET including the gate electrode formed on the semiconductor substrate, and the lowermost wiring layer including the directly-above wiring in contact with the upper portion of the gate electrode and the on-substrate wiring formed on the semiconductor substrate are formed. Further, in the memory cell formation region, the first wiring layer formed above the lowermost wiring layer, the second wiring layer formed above the first wiring layer and including the word line, and the third wiring layer formed above the second wiring layer and including the first wiring are formed. Here, the directly-above wiring and the on-substrate wiring are electrically connected to each other inside the lowermost wiring layer, and the wiring network including the directly-above wiring and the on-substrate wiring is formed inside the lowermost wiring layer.

<Features in First Embodiment>

Next, feature points in the present first embodiment will be described. The first feature point in the present first embodiment is that, for example, the word line WL formed in the second wiring layer and the auxiliary line AL formed in the third wiring layer are electrically connected to each other as illustrated in FIGS. 8 and 9. Thus, according to the present first embodiment, the resistance of the word line WL can be decreased. That is, by the electrical connection between the word line WL formed in the second wiring layer and the auxiliary line AL formed in the third wiring layer, the auxiliary line AL formed in the third wiring layer can also function as a word line. This means increase in the number of the wiring functioning as the word line. In this configuration, this means that a resistance value of the word line can be reduced as a whole more than that in a case of usage of only the word line WL formed in the second wiring layer. That is, the word line is configured of the word line WL and the auxiliary line AL connected in parallel with each other, so that the resistance of the word line as a whole can be decreased. As a result, even in the memory cell arranged at the position spaced apart from the word driver, the rising waveform distortion of the word line voltage can be improved, so that the reading speed can be improved. That is, according to the present first embodiment, the high-speed operation in the SRAM using the FINFET can be achieved.

Thus, based on the basic idea to effectively utilize the space created in the third wiring layer (M3) by the zero-th wiring layer (M0) which can exist because of the miniaturization of the FINFET, the present first embodiment adopts a configuration in which the auxiliary line AL is arranged in the space created in the third wiring layer, and in which the auxiliary line AL and the word line WL are electrically connected to each other. This manner achieves a measure (devisal) based on such new knowledge that the rising time of the word line voltage is largely affected by the wiring resistance of the word line, so that the high-speed operation in the SRAM using the FINFET can be achieved. That is, in the present first embodiment, the basic idea in the present first embodiment is used from the viewpoint of decreasing the resistance of the word line WL. Thus, the performance of the SRAM including the FINFET is improved.

Particularly, from the viewpoint of decreasing the resistance of the word line as a whole, it is desired to, for example, electrically connect the word line WL formed in the second wiring layer and the auxiliary line AL formed in the third wiring layer by the plurality of plugs PLG3B as illustrated in FIG. 9. This is because the resistance of the word line as a whole can be lower by using the plurality of plugs PLG3B for the electrical connection between the word line WL and the auxiliary line AL than that in a case in which the word line WL and the auxiliary line AL are connected to each other by the single plug PLG3B. Therefore, by at least the electrical connection between the word line WL and the auxiliary line AL, the high-speed operation in the SRAM caused by the decrease in the resistance of the word line as a whole can be achieved. However, in order to further decrease the resistance of the word line as a whole to improve the high-speed operability of the SRAM, it is desired to use the plurality of plugs PLG3B for the electrical connection between the word line WL and the auxiliary line AL.

Subsequently, the second feature point in the present first embodiment is that, for example, the power supply line VL2 formed in the second wiring layer and the power supply line VL3 formed in the third wiring layer are electrically connected to each other as illustrated in FIGS. 8 and 9. Thus, according to the present first embodiment, the stability of the power supply line can be improved. More specifically, by the electrical connection between the power supply line VL2 formed in the second wiring layer and the power supply line VL3 formed in the third wiring layer, a resistance value of the power supply line as a whole can be decreased. This can suppress a power supply drop (voltage drop) in the power supply line. As a result, the operation stability of the SRAM can be improved.

Particularly in the SRAM using the FINFET, the power supply voltage used in the SRAM can be decreased as the FINFET is miniaturized. Thus, power consumption in the SRAM can be reduced. Meanwhile, the decrease in the power supply voltage also means that the power supply drop easily affects. In this case, when a degree of the power supply drop increases, such a risk that the SRAM does not normally operate increases. Regarding this point, in the present first embodiment, the power supply line VL2 formed in the second wiring layer and the power supply line VL3 formed in the third wiring layer are connected in parallel with each other, and therefore, the resistance value of the power supply line as a whole can be reduced. This means that a power supply drop based on a parasitic resistance (wiring resistance) is suppressed in the power supply line as a whole in the present first embodiment, so that this can improve the operation stability of the SRAM. That is, according to the present first embodiment, by the usage of the miniaturized FINFET for the SRAM, power consumption can be reduced based on the reduction in the power supply voltage, and the resistance of the power supply line as a whole can be reduced by the second feature point in the present first embodiment. Thus, the operation instability of the SRAM due to the power supply drop can be resolved. That is, the present first embodiment can obtain such superior effects as reducing the power consumption of the SRAM and as improving the operation stability of the SRAM.

From the viewpoint of decreasing the resistance of the power supply line as a whole, note that it is desired to electrically connect the power supply line VL2 and the power supply line VL3 by the plurality of plugs PLG3A. This is because the resistance of the power supply line as a whole can be made lower by the electrical connection between the power supply line VL2 and the power supply line VL3 by the plurality of plugs PLG3A than that in a case in which the power supply line VL2 and the power supply line VL3 are electrically connected to each other by the single plug PLG3A. In this case, the resistance of the power supply line as a whole can be further decreased, so that the power supply drop does not easily occur. Thus, the operation stability of the SRAM can be further improved.

As described above, in the present first embodiment, the basic idea in the present first embodiment is utilized from the viewpoint (the first feature point) of achieving the decrease in the resistance of the word line as a whole and the viewpoint of achieving the decrease in the resistance of the power supply line as a whole. More specifically, (the first feature point) the auxiliary line AL electrically connected to the word line WL is arranged in the space created in the third wiring layer in order to decrease the resistance of the word line as a whole, and (the second feature point) the power supply line VL3 electrically connected to the power supply line VL2 is arranged in the space created in the third wiring layer in order to decrease the resistance of the power supply line as a whole. As a result, according to the present first embodiment, the performance of the SRAM including the FINFET can be improved.

Modified Example

Figure 10:
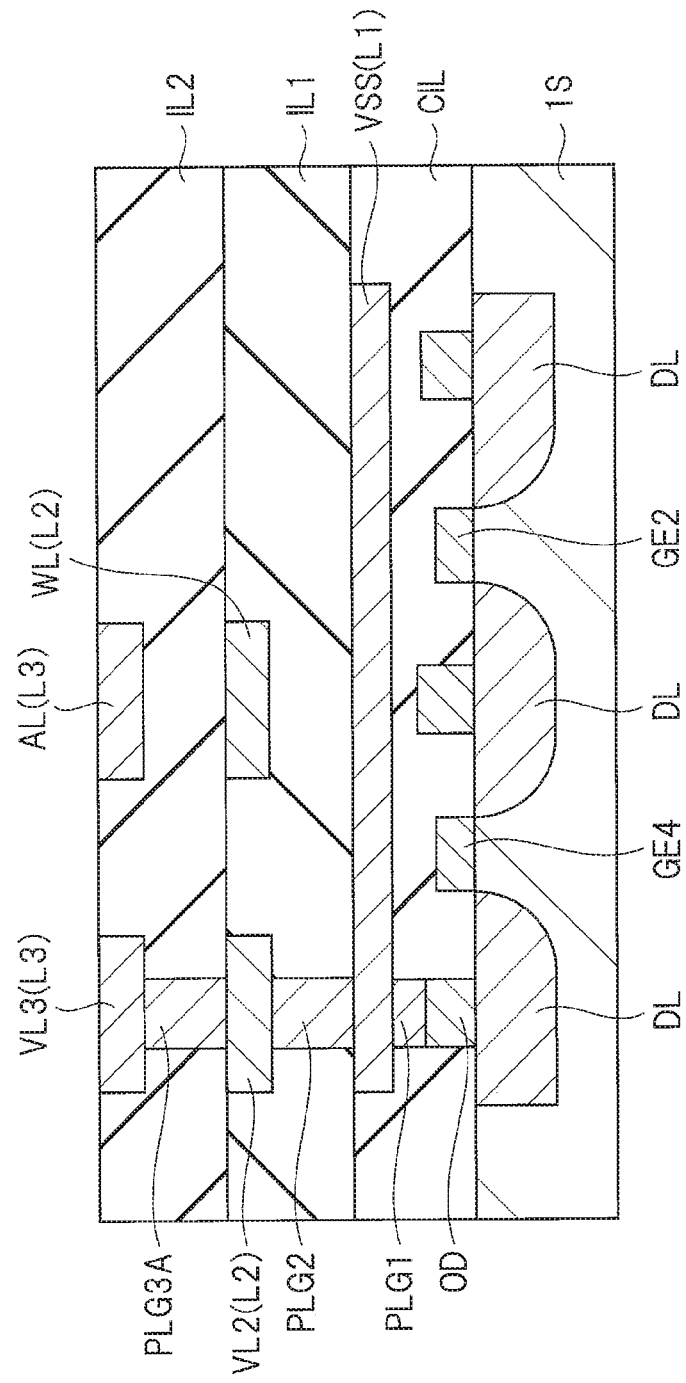
FIG. 10 is a cross-sectional view illustrating a modified example corresponding to FIG. 8.

Next, a modified example in the present first embodiment will be described. FIG. 10 is a diagram corresponding to FIG. 8, and is one cross-sectional view of a memory cell in the modified example. Similarly, FIG. 11 is a diagram corresponding to FIG. 9, and is one cross-sectional view of the memory cell in the modified example.

Figure 11:
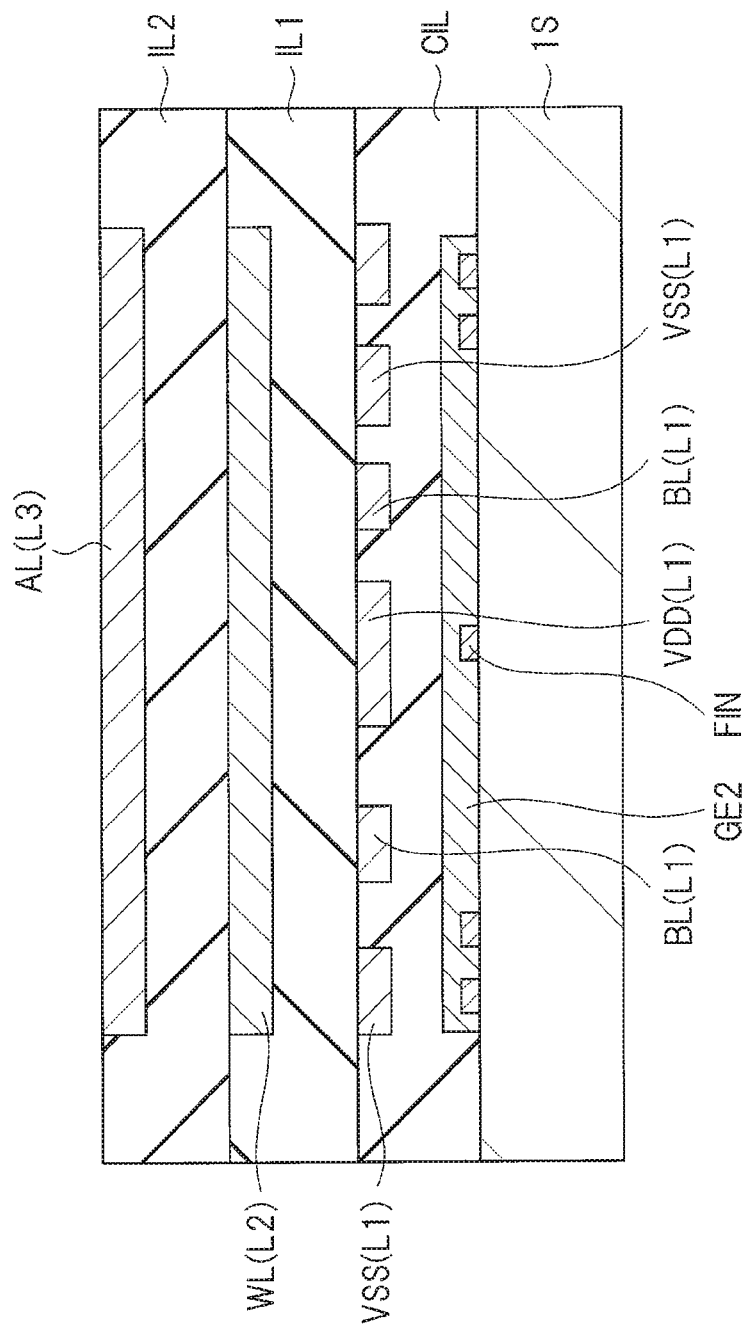
FIG. 11 is a cross-sectional view illustrating a modified example corresponding to FIG. 9.

As illustrated in FIGS. 10 and 11, a feature point in the modified example is that a word line WL formed in a second wiring layer and an auxiliary line AL formed in a third wiring layer are not electrically connected to each other but arranged to overlap each other in both a cross-sectional view and a plan view. Thus, the word line WL can be difficult to be affected by external noise. That is, as a result of such arrangement as overlapping the word line WL and the auxiliary line AL, the auxiliary line AL functions as a shield line for protecting the word line WL from the external noise, so that a resistance of the word line WL to the noise can be improved. Thus, according to the present modified example, an erroneous operation in an SRAM due to superimposition of the noise on the word line WL can be suppressed. Therefore, the operation reliability of the SRAM can be improved.

As described above, in the present modified example, the basic idea in the first embodiment is utilized from the viewpoint of improving the resistance of the word line WL to the noise. More specifically, in order to improve the resistance of the word line WL to the noise, the auxiliary line AL overlapping the word line WL in a plan view and a cross-sectional view is arranged in a space created in the third wiring layer. As a result, according to the present modified example, the auxiliary line AL can be functioned as a shield for protecting the word line WL from the external noise, so that the resistance of the word line WL to the noise can be improved. That is, according to the present modified example, the operation reliability of the SRAM including the FINFET can be improved.

Second Embodiment

<Basic Idea in Second Embodiment>

FIG. 12(a) is a table illustrating a wiring layer in a peripheral circuit of an SRAM using a planar type FET. As illustrated in FIG. 12(a), the zero-th wiring layer (M0) cannot be provided in the peripheral circuit using the planar type FET, and therefore, a first wiring layer (M1) to a fourth wiring layer (M4) are used. More specifically, a contact wiring, a signal wiring, and a power supply line are arranged in the first wiring layer (M1), and a signal wiring and a power supply line are arranged in the second wiring layer (M2). A signal wiring and a power supply line are arranged in the third wiring layer (M3), and a power supply line is arranged in the fourth wiring layer (M4).

On the other hand, FIG. 12(b) is a table illustrating a wiring layer in a peripheral circuit of an SRAM using a FINFET. As illustrated in FIG. 12(b), the zero-th wiring layer (M0) can be provided in the peripheral circuit using the FINFET, and therefore, the zero-th wiring layer (M0) to a fourth wiring layer (M4) are used. More specifically, a contact wiring, a signal wiring, and a power supply line are arranged in the zero-th wiring layer (M0), and a signal wiring and a power supply line are arranged in the first wiring layer (M1). A signal wiring and a power supply line are arranged in the second wiring layer (M2), and a power supply line is arranged in the fourth wiring layer (M4). Therefore, in the peripheral circuit using the FINFET, the zero-th wiring layer can be provided by the miniaturization of the FINFET. Thus, as illustrated in FIG. 12(b), for example, the third wiring layer (M3) is not used. In other words, in the peripheral circuit using the FINFET, a space is created in the third wiring layer (M3).

However, a gate electrode of the FINFET is also formed in the zero-th wiring layer (M0), and it is required to arrange a plurality of wirings configuring the zero-th wiring layer so as to avoid the gate electrode of the FINFET. That is, since the gate electrode of the FINFET also exists in the zero-th wiring layer, a layout of wirings in the zero-th wiring layer has a larger limitation than those in the other first to fourth wiring layers. Thus, the case of the formation of the signal wiring, the power supply line, and the contact wiring configuring the peripheral circuit in the zero-th to second wiring layers and the fourth wiring layer in the peripheral circuit using the FINFET has the larger limitation in the layout than the case of the formation of the signal wiring, the power supply line, and the contact wiring configuring the peripheral circuit in the first to fourth wiring layers in the peripheral circuit using the planar type FET. As a result, in the peripheral circuit using the FINFET, when the signal wiring, the power supply line, and the contact wiring configuring the peripheral circuit are formed in the zero-th to second wiring layers and the fourth wiring layer, the occupied area of the peripheral circuit increases. That is, the occupied area of the peripheral circuit cannot be sufficiently reduced regardless of using the FINFET which is more miniaturized than the planar type FET.

Therefore, in the present second embodiment, in order to reduce the occupied area of the peripheral circuit, the space created in the third wiring layer is effectively utilized. That is, a basic idea in the present second embodiment is an idea to effectively utilize the space created in the third wiring layer (M3) by the zero-th wiring layer (M0) which can exist because of the miniaturization of the FINFET. That is, the basic idea in the second embodiment is an idea to effectively utilize the third wiring layer which is unnecessary as the wiring layer configuring the peripheral circuit. Particularly, the space created in the third wiring layer is used from the viewpoint of reducing the area of the peripheral circuit. More specifically, in the peripheral circuit using the FINFET, as illustrated in FIG. 12(c), a signal wiring, a power supply line, and a contact wiring configuring the peripheral circuit are formed by using not only zero-th to second wiring layers and a fourth wiring layer but also a third wiring layer in which a space is created. Thus, the number of wiring layers in which wirings required for the peripheral circuit can be arranged can be increased. Therefore, the planar size (the layout area) of the peripheral circuit can be reduced. That is, FIG. 12(c) is a table illustrating the wiring layers in the peripheral circuit of the SRAM using the FINFET obtained when the basic idea in the present second embodiment is adopted. As illustrated in FIG. 12(c), in the present second embodiment, it is found that not only the zero-th to second wiring layers and the fourth wiring layer but also the third wiring layer in which the space is created is used. This point is on the basic idea in the present second embodiment. In the following, this basic idea is embodied so that a layout of the peripheral circuit is achieved. An example of embodying the basic idea in the present second embodiment will be described below. More specifically, an example of a configuration in which the space created in the third wiring layer is effectively utilized from the viewpoint of reducing the occupied area of the peripheral circuit of the SRAM will be described.

<Layout Configuration of Memory Module>

Figure 13:
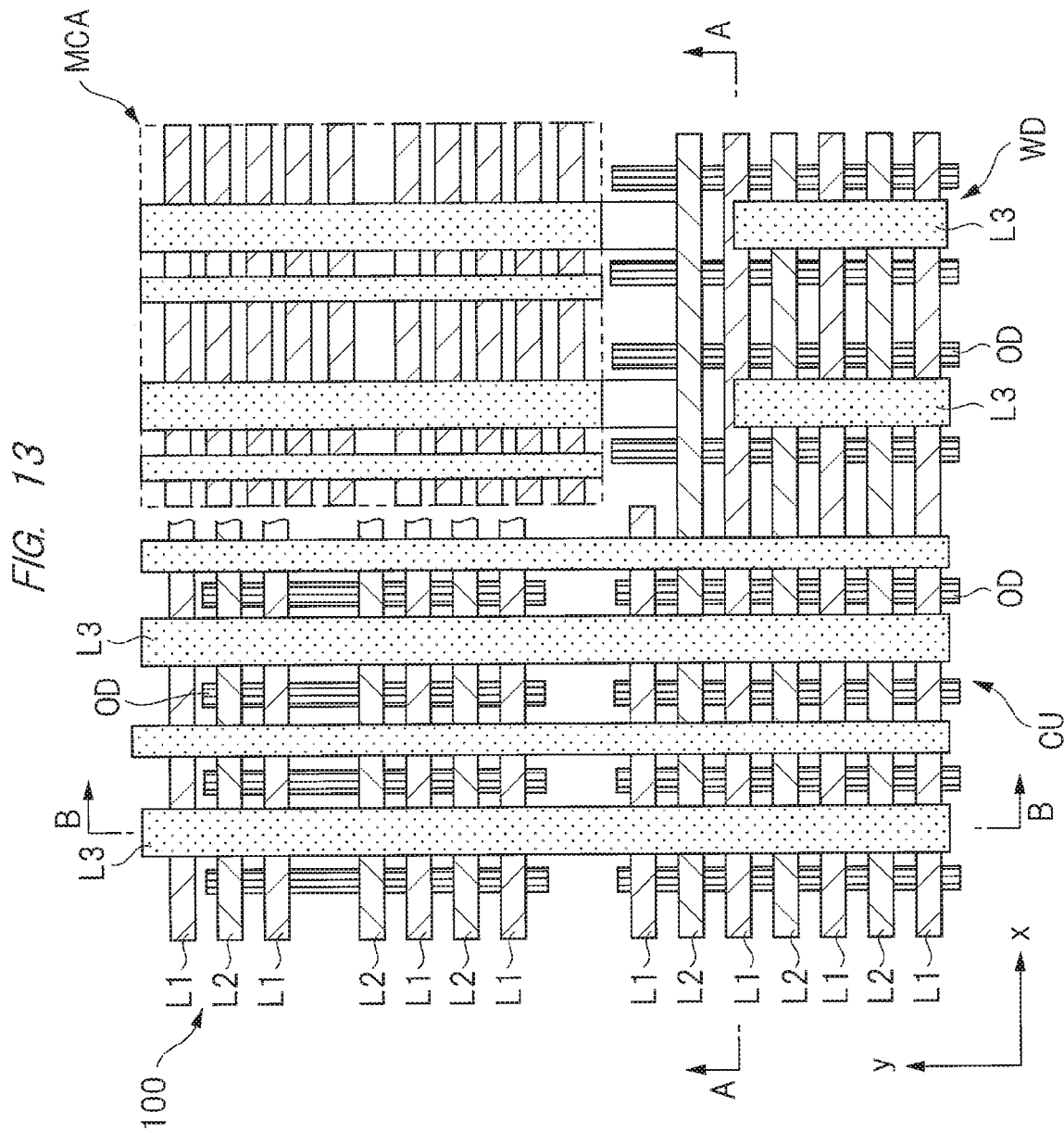
FIG. 13 is a plan view illustrating a layout configuration of a memory module in the second embodiment.

FIG. 13 is a plan view illustrating a layout configuration of a memory module in the present second embodiment. As illustrated in FIG. 13, the memory module in the present second embodiment includes a memory cell array MCA, an I/O circuit 100, a control circuit unit CU, and a word driver WD. In FIG. 13, each of the I/O circuit 100, the control circuit unit CU, and the word driver WD configuring a peripheral circuit includes on-substrate wiring OD formed in a zero-th wiring layer, wiring L1 formed in a first wiring layer, wiring L2 formed in a second wiring layer, and wiring L3 formed in a third wiring layer, so that it is found that the basic idea in the present second embodiment is reflected.

Particularly in the layout illustrated in FIG. 13, the on-substrate wiring OD extending in a direction in parallel to a word line (in a y-direction) is formed in the zero-th wiring layer serving as the lowermost wiring layer of the peripheral circuit. Although not illustrated in FIG. 13A, a gate electrode of a FINFET is also formed in the zero-th wiring layer, so that the zero-th wiring layer is configured of only the on-substrate wiring OD in parallel to the extending direction of the gate electrode of the FINFET (in the y-direction) due to the limitation caused by the existence of the gate electrode. In FIG. 13, each of the plurality of wirings L1 formed in the first wiring layer extends in an x-direction, and the plurality of wirings L1 include a signal wiring and a power supply line. Further, in FIG. 13, each of the plurality of wirings L2 formed in the second wiring layer also extends in the x-direction, and the plurality of wirings L2 include a signal wiring and power supply line. Therefore, in the present second embodiment, both the wiring L1 formed in the first wiring layer and the wiring L2 formed in the second wiring layer are arranged to extend in the x-direction.

Subsequently, in FIG. 13, each of the plurality of wirings L3 formed in the third wiring layer extends in the y-direction, and the plurality of wirings L3 include a signal wiring and a power supply line. From the above description, for example, the signal wiring formed in the second wiring layer and the signal wiring formed in the third wiring layer are supposed to extend in directions intersecting each other. The signal wiring formed in the second wiring layer and the signal wiring formed in the third wiring layer can also be configured not to be electrically connected to each other, or can be configured to be electrically connected to each other.

<Cross-Sectional Configuration of Peripheral Circuit>

Figure 14:
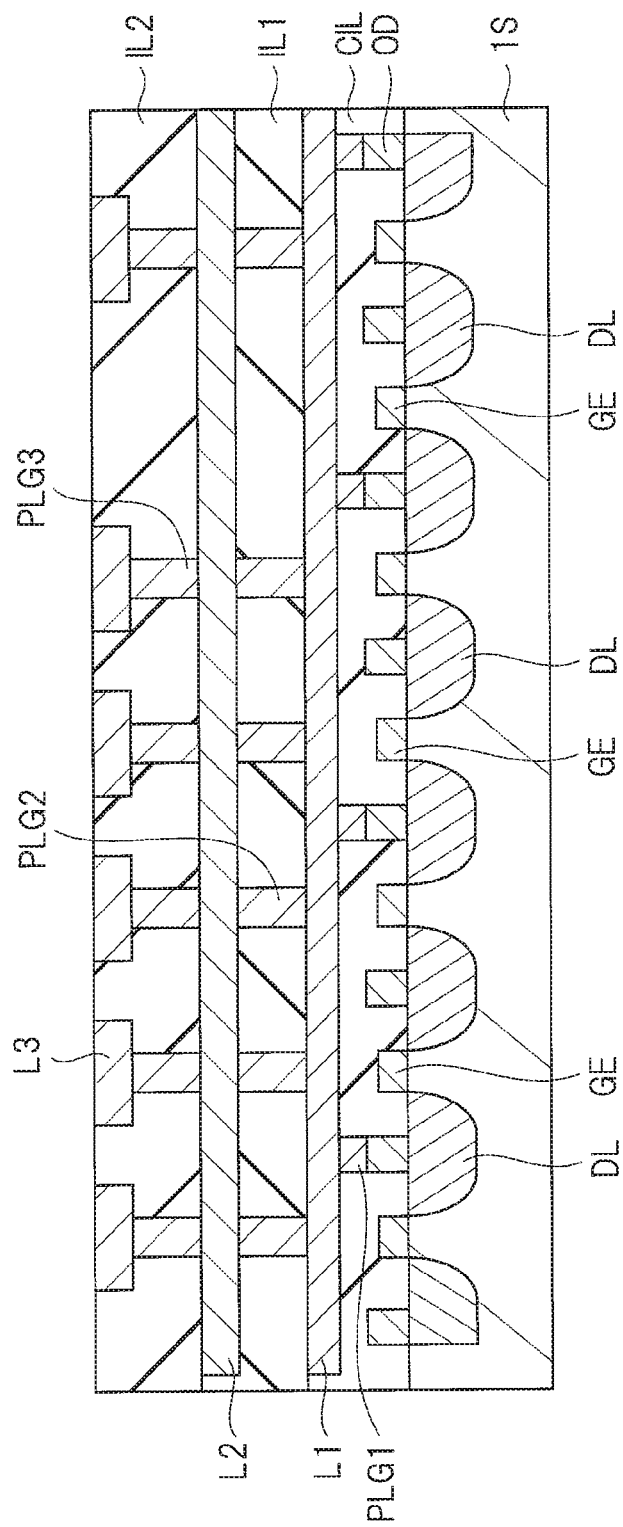
FIG. 14 is a cross-sectional view cut along a line A-A illustrated in FIG. 13.

FIG. 14 is a cross-sectional view cut along a line A-A illustrated in FIG. 13. As illustrated in FIG. 14, diffusion layers DL each serving as a semiconductor region are formed inside the semiconductor substrate 15, and gate electrodes GE in the FINFET and the on-substrate wirings OD are formed on the semiconductor substrate 15. A contact interlayer insulating film CIL is formed to cover the gate electrodes GE and the on-substrate wirings OD, and plugs PLG1 and the wiring L1 are formed in the contact interlayer insulating film CIL. For example, the on-substrate wirings OD and the wiring L1 are electrically connected to each other by the plugs PLG1.

Next, as illustrated in FIG. 14, an interlayer insulating film IL1 is formed on the contact interlayer insulating film CIL including the upper portion of the wiring L1, and plugs PLG2 and the wiring L2 are formed in the interlayer insulating film IL1. The wiring L1 and the wiring L2 are electrically connected to each other by, for example, the plurality of plugs PLG2. Further, as illustrated in FIG. 14, an interlayer insulating film 1L2 is formed on the interlayer insulating film IL1 including the upper portion of the wiring L2, and plugs PLG3 and the wirings L3 are formed in the interlayer insulating film IL2. For example, the wiring L2 and the wiring L3 are electrically connected to each other by the plugs PLG3.

Figure 15:
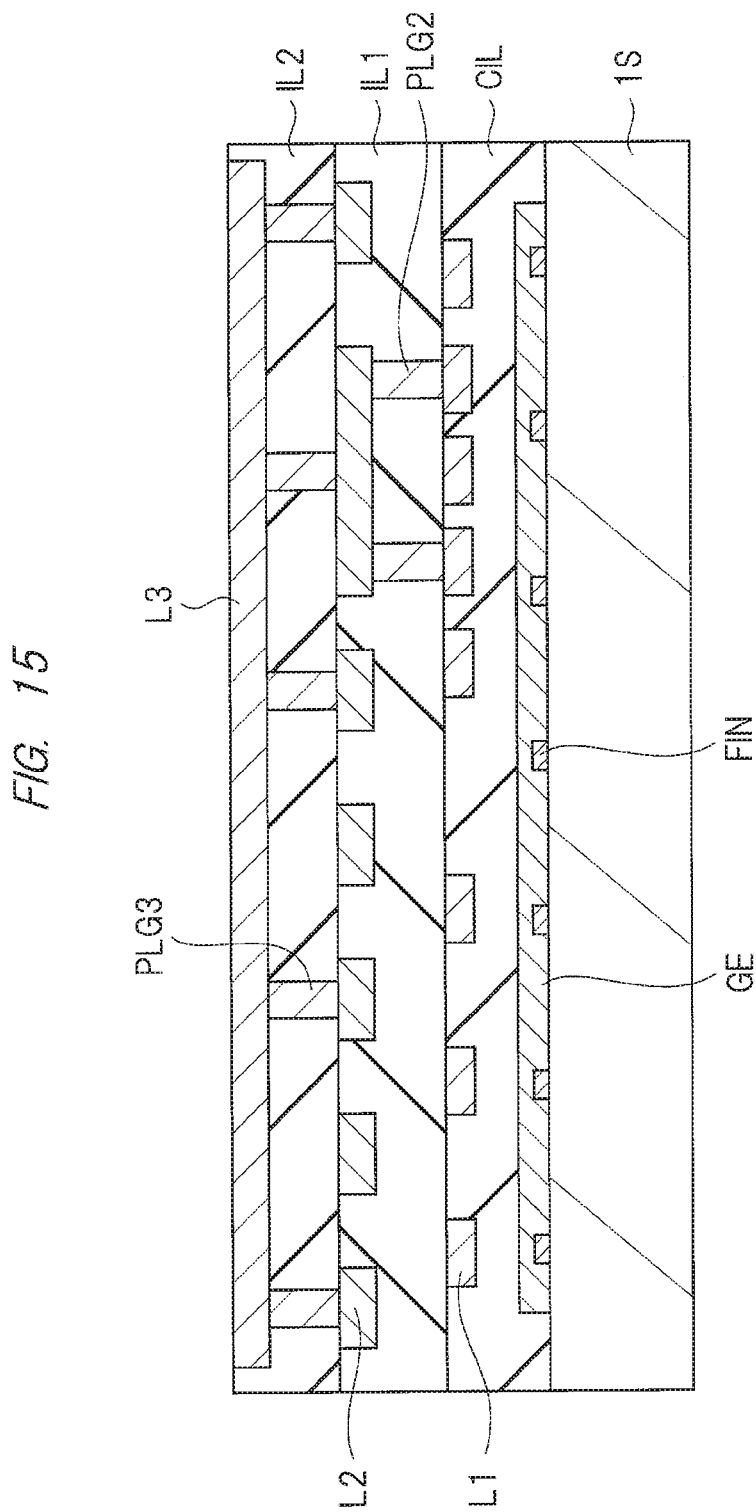
FIG. 15 is a cross-sectional view cut along a line B-B illustrated in FIG. 13.

FIG. 15 is a cross-sectional view cut along a line B-B illustrated in FIG. 13. As illustrated in FIG. 14, the fins FIN and the gate electrode GE in the FINFET are formed on the semiconductor substrate 15. A contact interlayer insulating film CIL is formed to cover the gate electrode GE, and the wirings L1 are formed in the contact interlayer insulating film CIL.

Next, as illustrated in FIG. 14, an interlayer insulating film IL1 is formed on the contact interlayer insulating film CIL including the respective upper portions of the wiring L1, and plugs PLG2 and the wiring L2 are formed in the interlayer insulating film IL1. The wirings L1 and the wirings L2 are electrically connected to each other by, for example, the plurality of plugs PLG2. Further, as illustrated in FIG. 14, an interlayer insulating film IL2 is formed on the interlayer insulating film IL1 including the respective upper portions of the wirings L2, and plugs PLG3 and the wiring L3 are formed in the interlayer insulating film IL2. For example, the wiring L2 and the wiring L3 are electrically connected to each other by the plug PLG3.

From the above description, in the present second embodiment, it is found that the wiring L3 is formed in the third wiring layer. That is, in the present second embodiment, the space is effectively utilizes by the formation of the wiring L3 in the third wiring layer to be the space. As a result, in the peripheral circuit in the present second embodiment, the signal wiring and the power supply wiring are arranged by using the zero-th to fourth wiring layers. Thus, the layout area (planar area) of the peripheral circuit can be made smaller than the case not using the third wiring layer. Thus, the occupied area of the memory module as a whole can be reduced. This means that the semiconductor chip (see, e.g., FIG. 1) can be downsized. Thus, the semiconductor device including the semiconductor chip can be downsized. The fact that the semiconductor chip can be downsized means that the number of semiconductor chips, which can be acquired from a semiconductor wafer, can be increased. This means that a manufacturing cost per the semiconductor chip can be reduced. Therefore, according to the present second embodiment, an effect capable of reducing the manufacturing cost of the semiconductor device can also be obtained.

<Connection Relation between Components in Memory Module>

(1) Connection Relation between Memory Cell Array MCA and Word Driver WD

Figure 16:
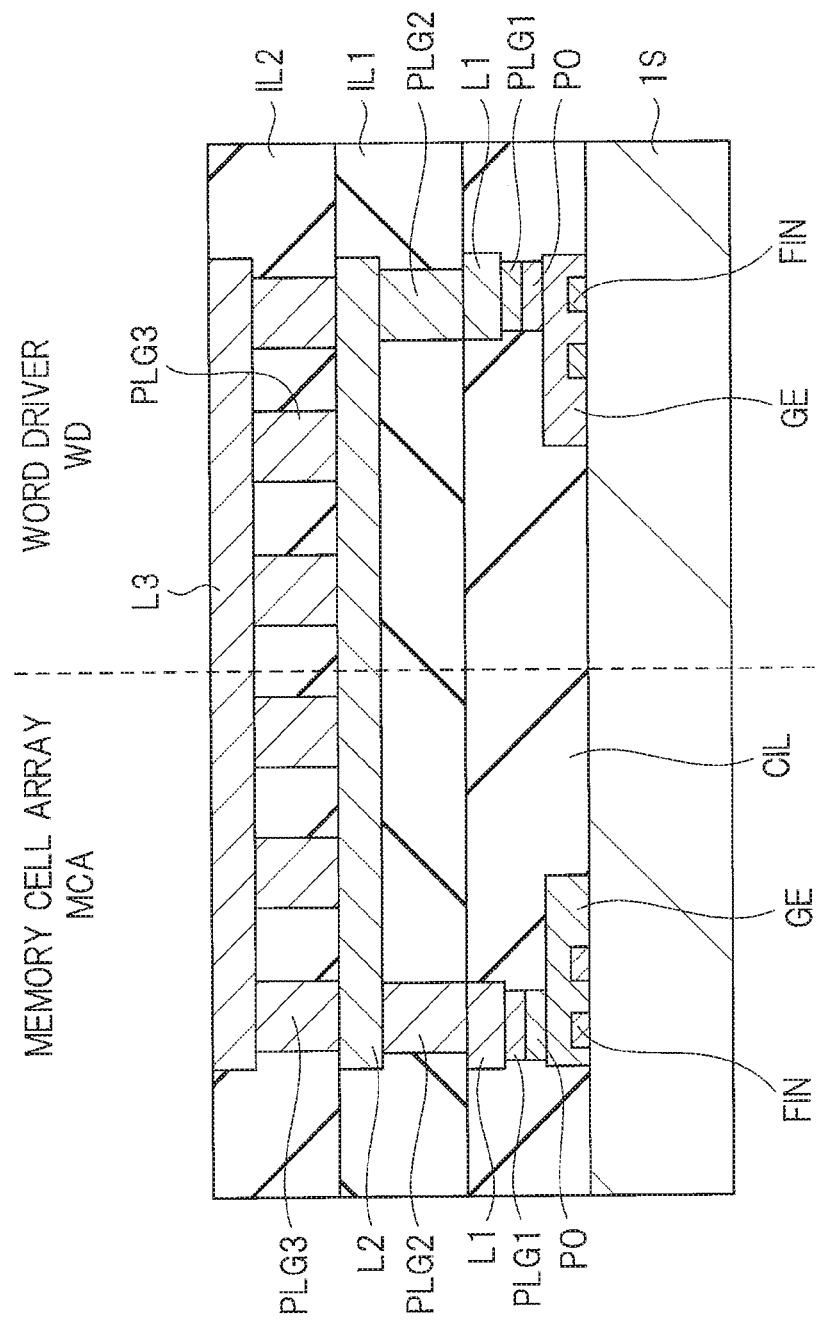
FIG. 16 is a cross-sectional view illustrating one example of a connection relation between a memory cell array and a word driver.

FIG. 16 is a cross-sectional view illustrating an example of a connection relation between a memory cell array MCA and a word driver WD. As illustrated in FIG. 16, the memory cell array MCA and the word driver WD can be electrically connected to each other by a wiring L2 formed in a second wiring layer and a wiring L3 formed in a third wiring layer, for example.

(2) Connection Relation between Memory Cell Array MCA and I/O Circuit 100

Figure 17:
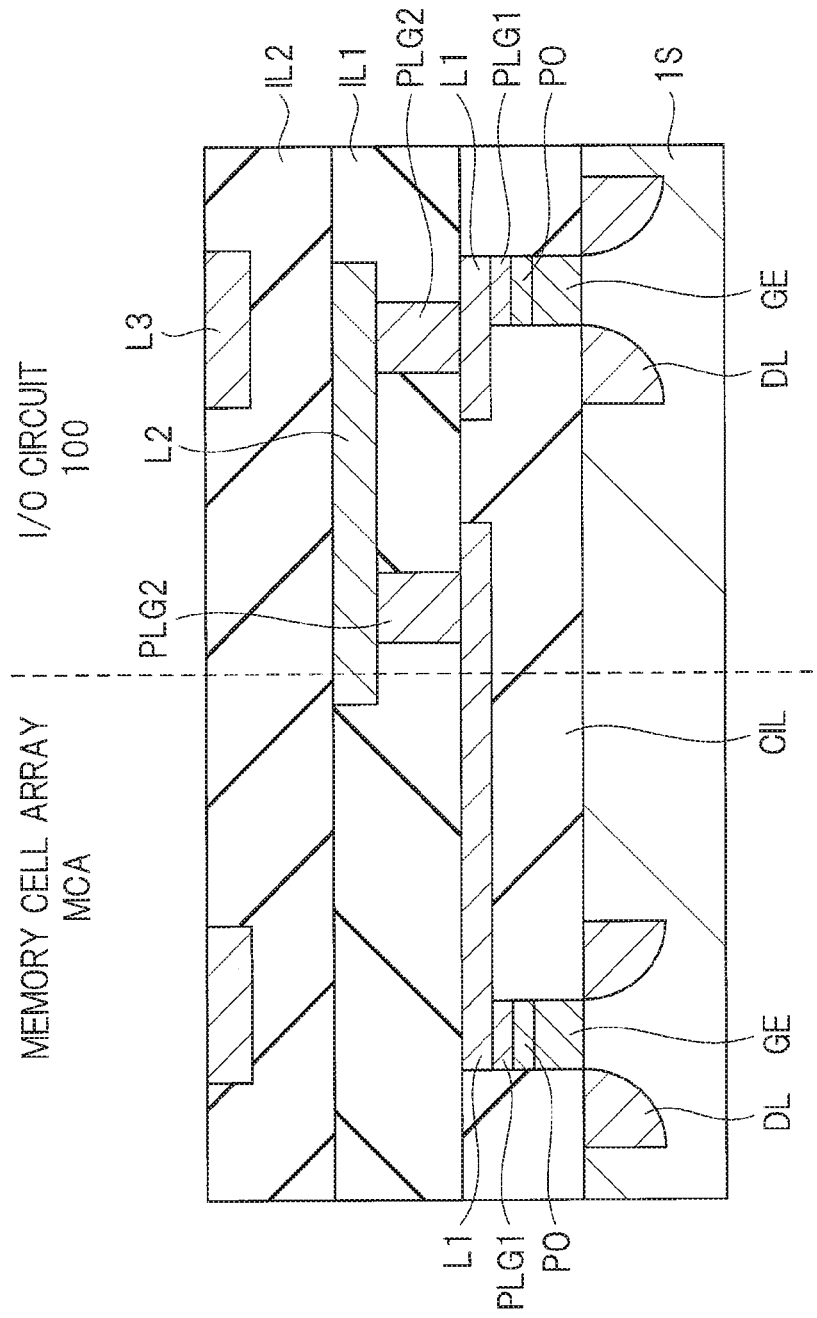
FIG. 17 is a cross-sectional view illustrating one example of a connection relation between a memory cell array and an I/O circuit.

FIG. 17 is a cross-sectional view illustrating an example of a connection relation between a memory cell array MCA and an I/O circuit 100. As illustrated in FIG. 17, the memory cell array MCA and the I/O circuit 100 can be electrically connected to each other by using, for example, a wiring L2 formed in a second wiring layer electrically connected to a wiring L1 formed in a first wiring layer in the memory cell array MCA and a wiring L1 formed in a first wiring layer in the I/O circuit 100 via plugs PLG2.

(3) Connection Relation between I/O Circuit 100 and Control Circuit Unit CU

Figure 18:
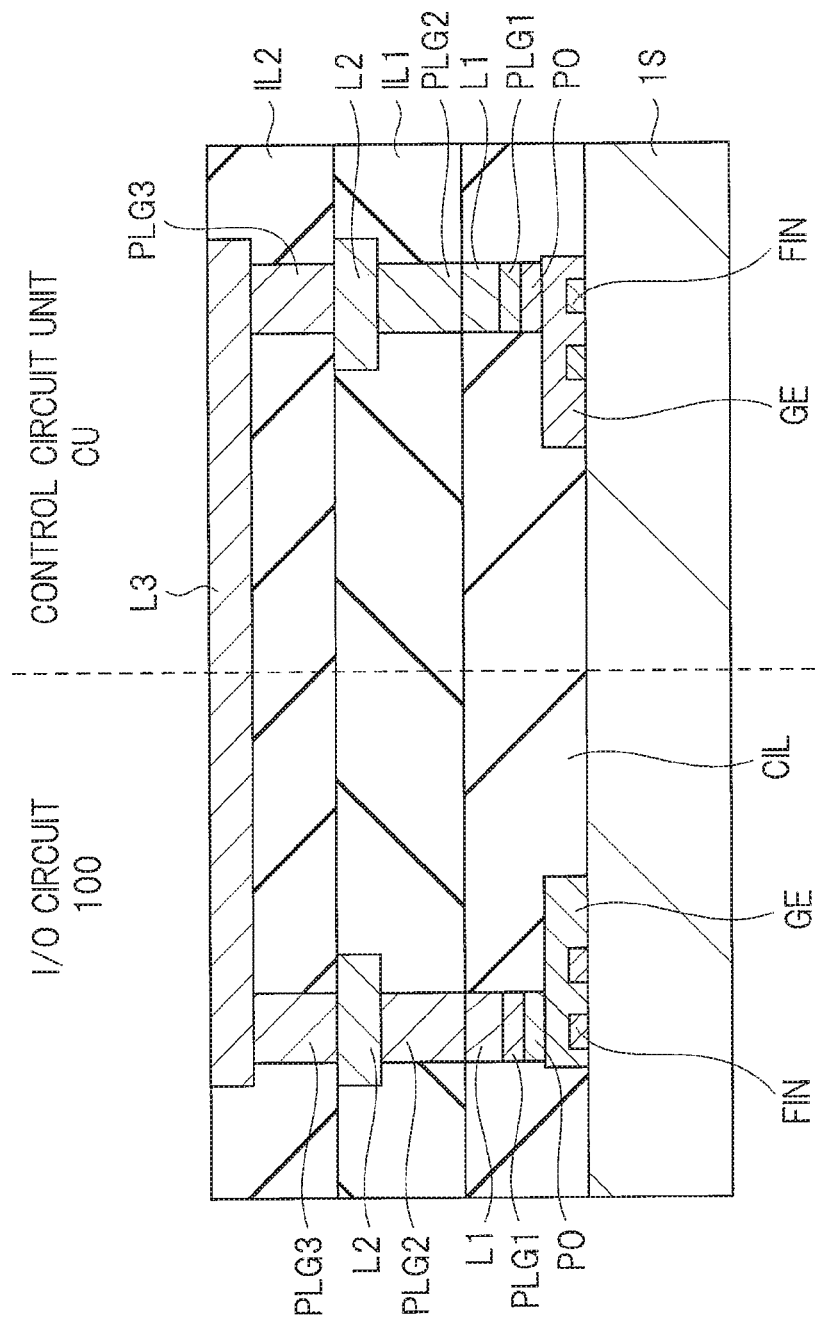
FIG. 18 is a cross-sectional view illustrating one example of a connection relation between an I/O circuit and a control circuit unit.

FIG. 18 is a cross-sectional view illustrating an example of a connection relation between an I/O circuit 100 and a control circuit unit CU. As illustrated in FIG. 18, the I/O circuit 100 and the control circuit unit CU can be electrically connected to each other by, for example, a wiring L3 formed in a third wiring layer.

(4) Connection Relation between Word Driver WD and Control Circuit Unit CU

Figure 19:
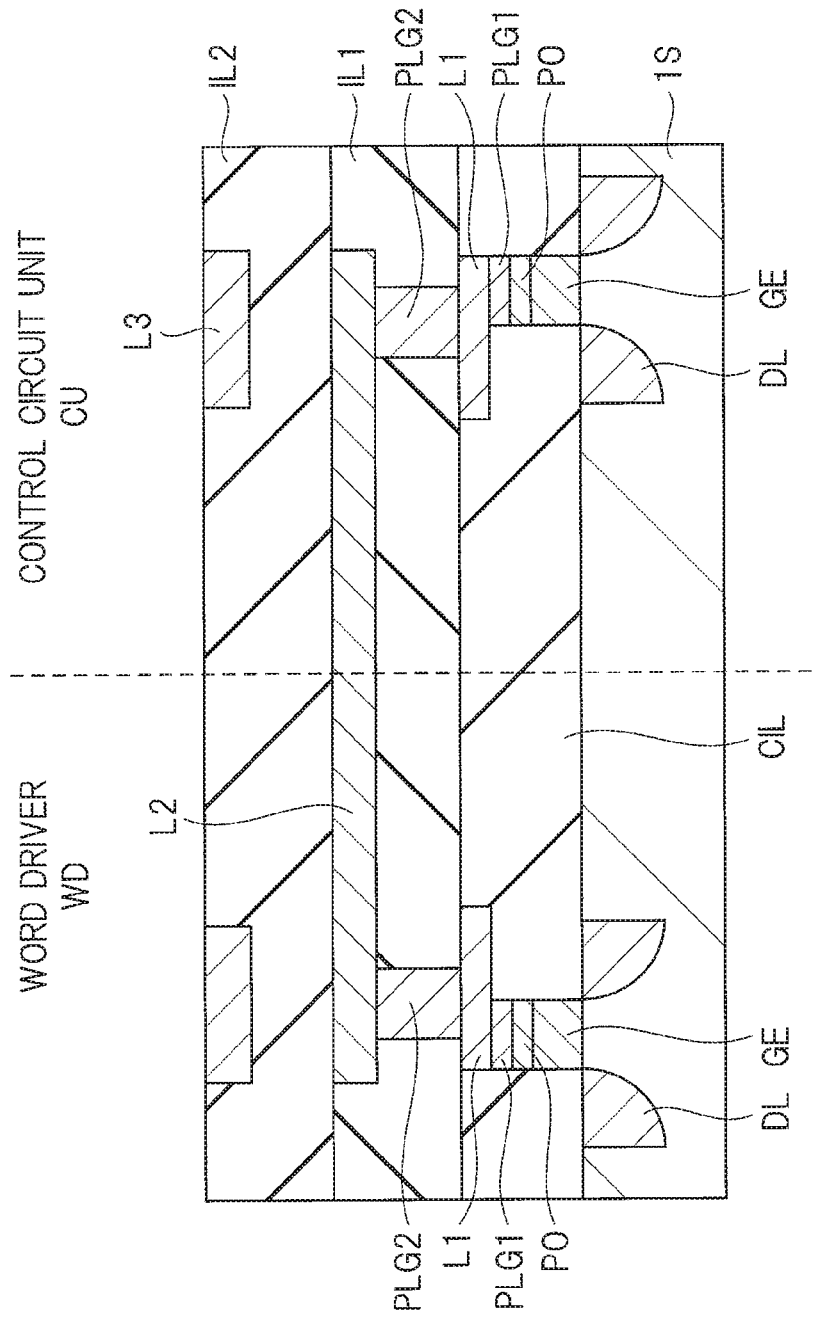
FIG. 19 is a cross-sectional view illustrating one example of a connection relation between a word driver and a control circuit unit.

FIG. 19 is a cross-sectional view illustrating an example of a connection relation between a word driver WD and a control circuit unit CU. As illustrated in FIG. 19, the word driver WD and the control circuit unit CU can be electrically connected to each other by, for example, a wiring L2 formed in a second wiring layer.

Third Embodiment

<Layout Configuration of Memory Module>

Figure 20:
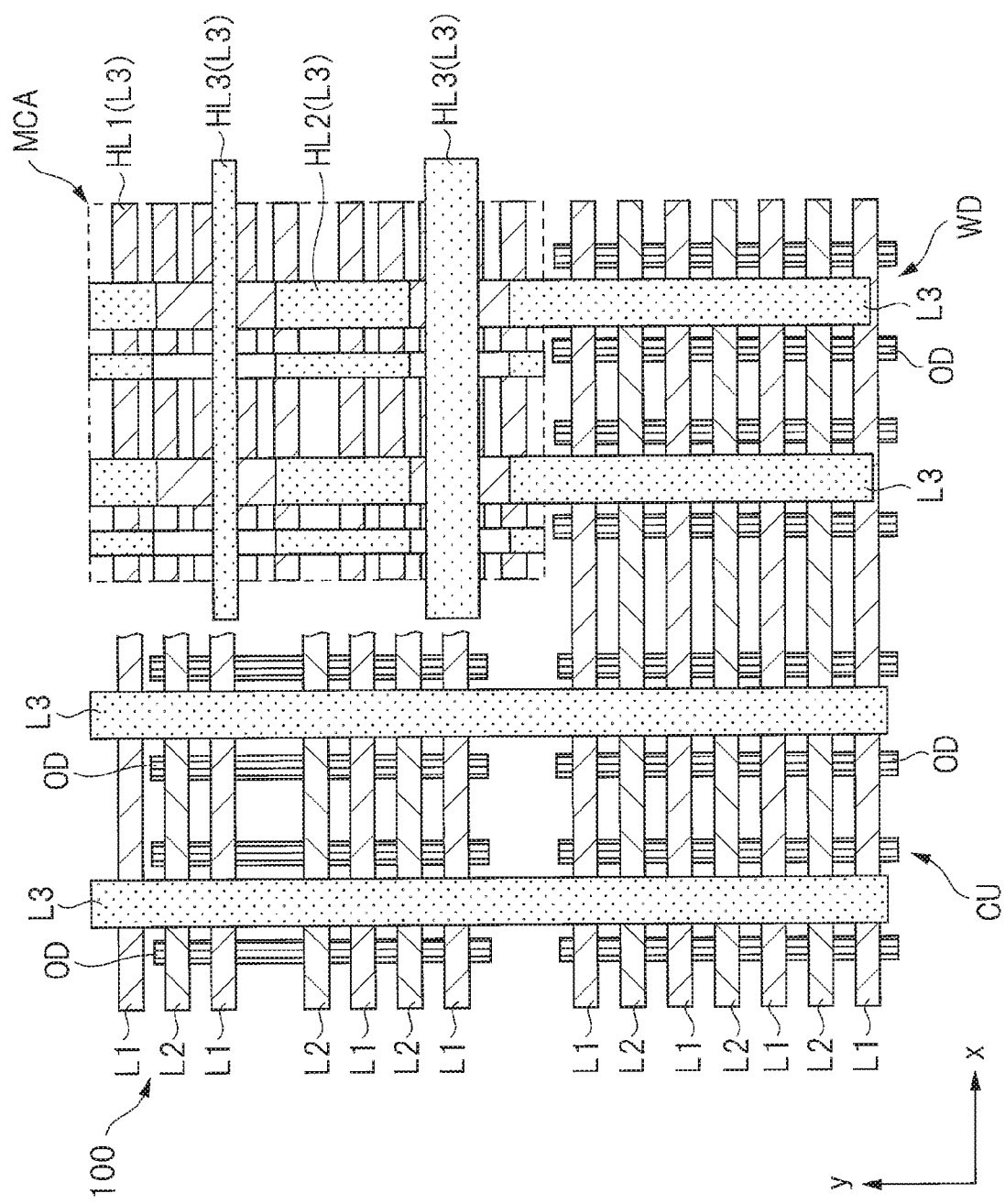
FIG. 20 is a plan view illustrating a layout configuration of a memory module in a third embodiment.

FIG. 20 is a plan view illustrating a layout configuration of a memory module in the present third embodiment. In FIG. 20, a wiring HL1 extending in a y-direction to overlap a word line formed in a second wiring layer, a wiring HL2 arranged in line with the wiring HL1 and extending in the y-direction to overlap the word line, and a wiring HL3 extending in an x-direction intersecting the word line in a plan view are formed in a third wiring layer in a memory cell array MCA. At this time, one end of the wiring HL1 and one end of the wiring HL2 are oppositely arranged spaced apart from each other in a plan view, and the wiring HL3 passes between one end of the wiring HL1 and one end of the wiring HL2 in a plan view and extends in the x-direction intersecting the word line. That is, in the present third embodiment, the wiring HL1 and the wiring HL2 are formed in the third wiring layer to partially overlap the word line, and the wiring HL3 extending in the x-direction intersecting the word line is arranged in a space between the wiring HL1 and the wiring HL2. Thus, according to the present third embodiment, the wiring HL1 and the wiring HL2 which are electrically connected to the word line can be formed in the third wiring layer while the wiring HL3 extending in the x-direction intersecting the word line is arranged in the third wiring layer. Thus, even when the third wiring layer has the wiring HL3 extending in the x-direction intersecting the word line, the resistance of the word line as a whole can be decreased by the wiring HL1 and the wiring HL2 which are arranged on the word line to sandwich the wiring HL3 therebetween in a plan view. Even when the wiring HL1 and the wiring HL2 arranged on the word line are not electrically connected to the word line, the wiring HL1 and the wiring HL2 function as a shield for protecting the word line from external noise as long as they are arranged to overlap the word line in a plan view.

For example, the wiring HL3 extending in the x-direction intersecting the word line is used as a wiring capacitance for generating a negative potential of a negative boost circuit connected to an I/O circuit 100. Note that it is not required to form the width of the wiring HL3 to be the same as the widths of the wiring HL1 and the width of the wiring HL2, and the width may be smaller or larger. The number of the wiring HL3 may be plural.

Fourth Embodiment

<Equivalent Circuit of Memory Cell>

Figure 21:
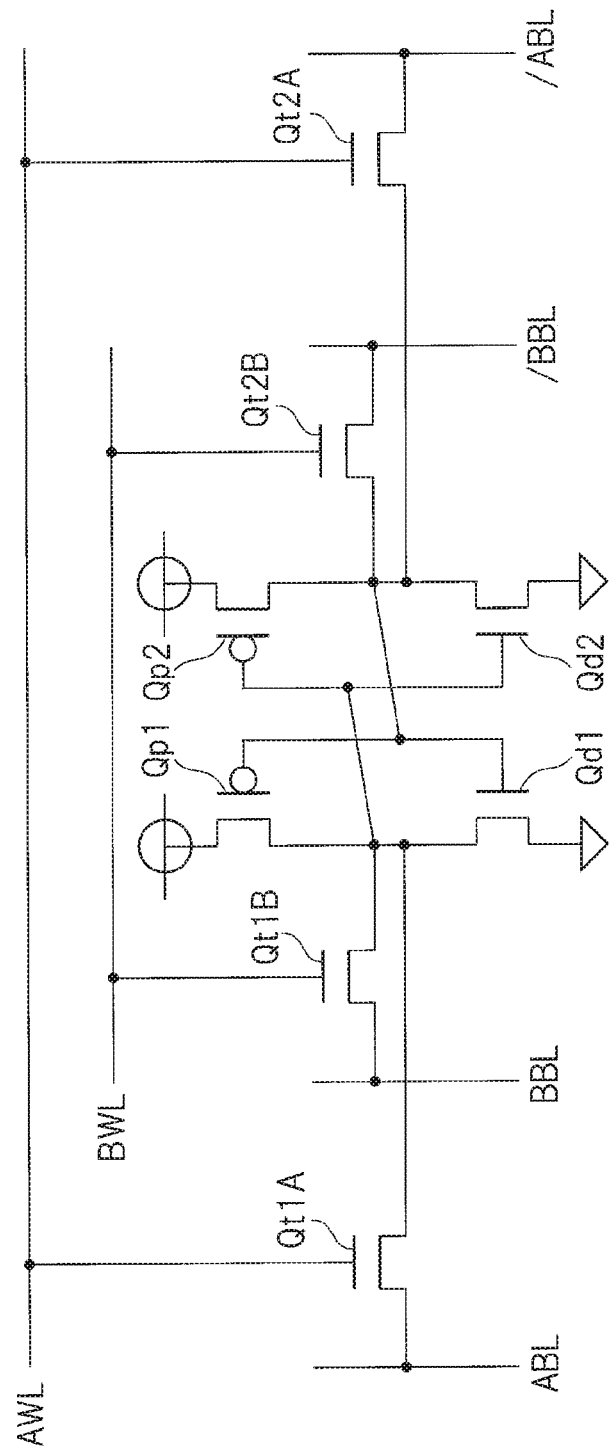
FIG. 21 is an equivalent circuit diagram illustrating a memory cell in a dual port SRAM.

FIG. 21 is an equivalent circuit diagram illustrating a memory cell in a dual port SRAM. As illustrated in FIG. 21, the dual port SRAM includes a pair of complementary bit line (ABL, /ABL), a pair of complementary bit lines (B-BL, /B-BL), and two word lines AWL and BWL. The memory cell in the dual port SRAM is configured of a pair of driving MISFETs (Qd1, Qd2), a pair of load MISFETs (Qp1, Qp2), a pair of transfer MISFETs (Qt1A, Qt2A), and a pair of transfer MISFETs (Qt1A, Qt2A). Each of the driving MISFETs (Qd1, Qd2) and the transfer MISFETs (Qt1A, Qt2A, Qt1B, Qt2B) is configured of an n-channel MISFET, and each of the load MISFETs (Qp1, Qp2) is configured of a p-channel MISFET.

The dual port SRAM configured as described above is provided with two outlets/inlets (ports) of a signal for inputting and outputting data, and has an advantage in that data processing can be performed at high speed because even if data is read from one of the ports, data can be simultaneously written from the other port.

<Layout Configuration of Memory Cell>

Figure 22:
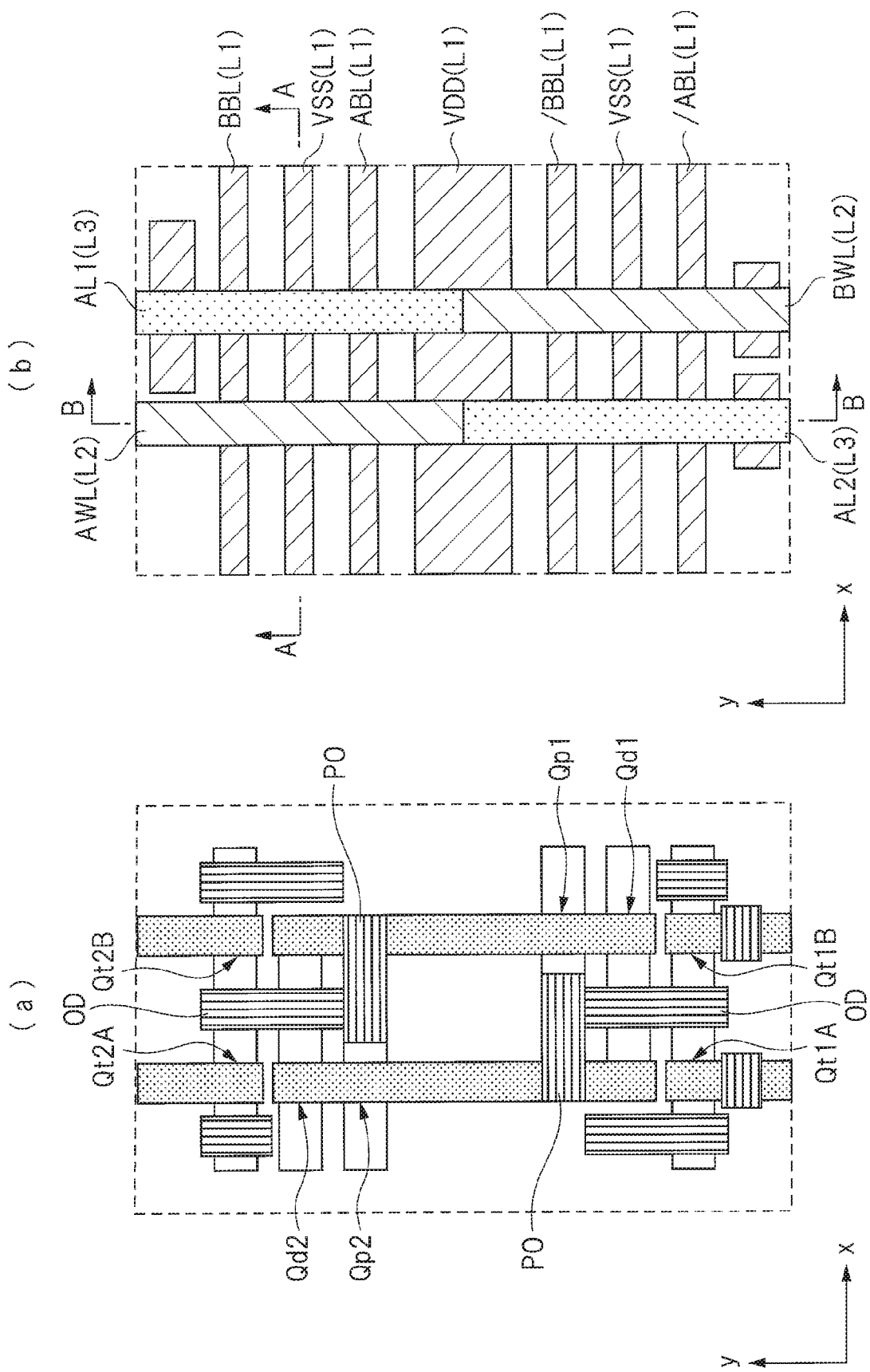
FIG. 22(a) is a plan view illustrating a layout configuration of the inside of a semiconductor substrate and a zero-th wiring layer.
FIG. 22(b) is a plan view illustrating a layout configuration of a first wiring layer to a third wiring layer.

FIG. 22 is a plan view illustrating a layout configuration of a memory cell. Particularly, FIG. 22(a) is a plan view illustrating a layout configuration of the inside of a semiconductor substrate and a zero-th wiring layer, and FIG. 22(b) is a plan view illustrating a layout configuration of first to third wiring layers. Note that a memory cell in an SRAM also has fourth and fifth wiring layers. However, description in the following specification and illustration in the following drawings of the wiring layers are omitted.

As illustrated in FIG. 22(a), the memory cell in the SRAM is configured of, for example, eight transistors (FINFETs) such as a pair of driving MISFETs (Qd1, Qd2), a pair of load MISFETs (Qp1, Qp2), a pair of transfer MISFETs (Qt1A, Qt2A), and a pair of transfer MISFETs (Qt1B, Qt2B) formed in a semiconductor substrate. At this time, each of the pair of the driving MISFETs (Qd1, Qd2), the pair of transfer MISFETs (Qt1A, Qt2A), and the pair of transfer MISFETs (Qt1B, Qt2B) is configured of an n-channel MISFET, and each of the pair of load MISFETs (Qp1, Qp2) is configured of a p-channel MISFET.

As illustrated in FIG. 22(a) a wiring network is formed in the zero-th wiring layer by forming the zero-th wiring layer including a directly-above wiring PO and an on-substrate OD on the semiconductor substrate and electrically connecting the directly-above wiring PO and the on-substrate wiring OD. As described above, the layout of the inside of the semiconductor substrate and the zero-th wiring layer is configured.

Subsequently, a layout configuration of the first wiring layer to the third wiring layer will be described with reference to FIG. 22(b). As illustrated in FIG. 22(b), a plurality of wirings L1 arranged in the first wiring layer include, for example, a power supply line VSS, a power supply line VDD, bit lines (ABL, BBL), and complementary bit lines (/ABL, /BBL). These wirings extend in the x-direction while being arranged to line in the y-direction. As illustrated in FIG. 22(b), wirings L2 arranged in the second wiring layer include a word line AWL and a word line BWL extending in the y-direction while being arranged in the x-direction. Further, wirings L3 arranged in the third wiring layer include, for example, an auxiliary line AL1 and an auxiliary line AL2, and these wirings extend in the y-direction while being arranged to line in the x-direction. Here, the word line AWL and the auxiliary line AL2 are electrically connected to each other, and the word line BWL and the auxiliary line AL1 are electrically connected to each other. The auxiliary line AL1 and the auxiliary line AL2 are alternately arranged in a plan view. As described above, the layout of the first to third wiring layers is configured.

<Cross-Sectional Configuration of Memory Cell>

Figure 23:
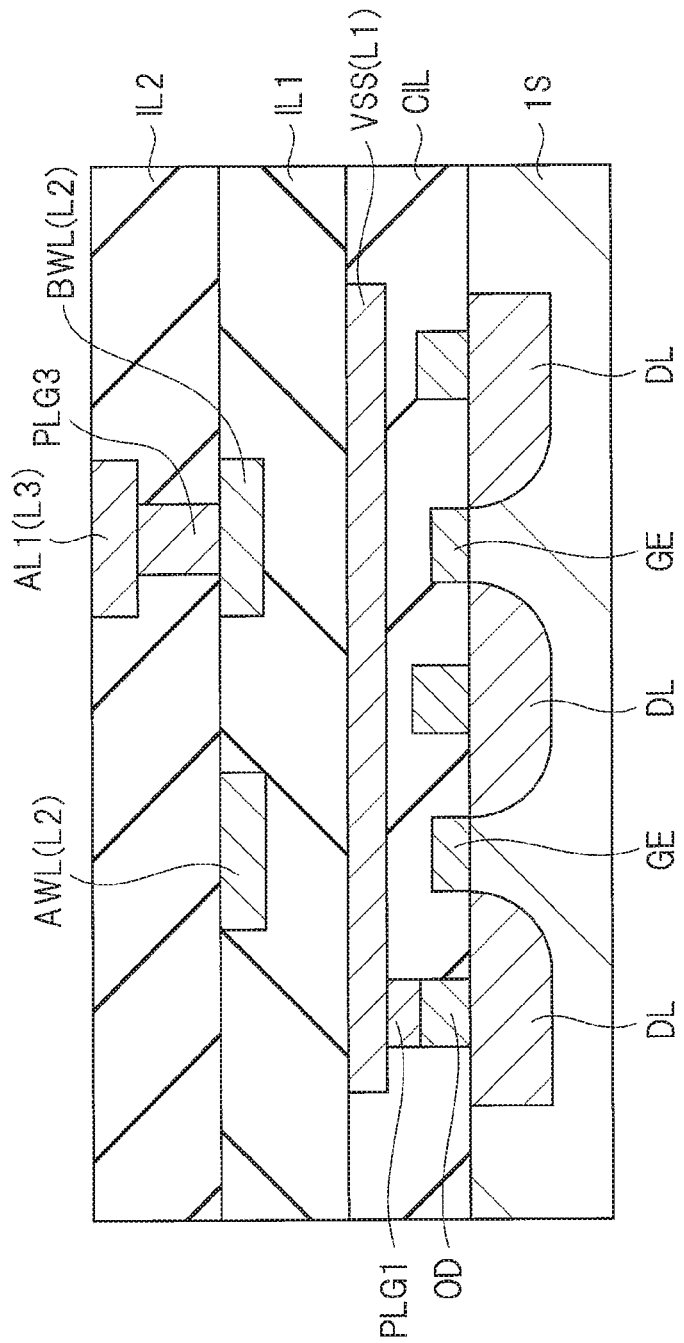
FIG. 23 is a cross-sectional view cut along a line A-A illustrated in FIG. 22(b)

Next, FIG. 23 is a cross-sectional view cut along a line A-A illustrated in FIG. 22(b). In FIG. 23, while diffusion layers are formed inside a semiconductor substrate 1S, gate electrodes GE and the on-substrate wiring OD are arranged on the semiconductor substrate 1S, and a contact interlayer insulating film CIL is formed to cover the gate electrodes GE and the on-substrate wiring OD. A plug PLG1 and the power supply line VSS are formed in the contact interlayer insulating film CIL, and, for example, the on-substrate wiring OD and the power supply line VSS are electrically connected to each other by the plug PLG1. Subsequently, an interlayer insulating film IL1 is formed on the contact interlayer insulating film CIL including the upper portion of the power supply line VSS, and the word line AWL and the word line BWL are formed in the interlayer insulating film IL1.

Next, an interlayer insulating film IL2 is formed on the interlayer insulating film IL1 including the upper portion of the word line AWL and the upper portion of the word line BWL, and the auxiliary line AL1 and a plug PLG3 are formed in the interlayer insulating film IL2. The word line BWL and the auxiliary line AL1 are electrically connected to each other by the plug PLG3.

Figure 24:
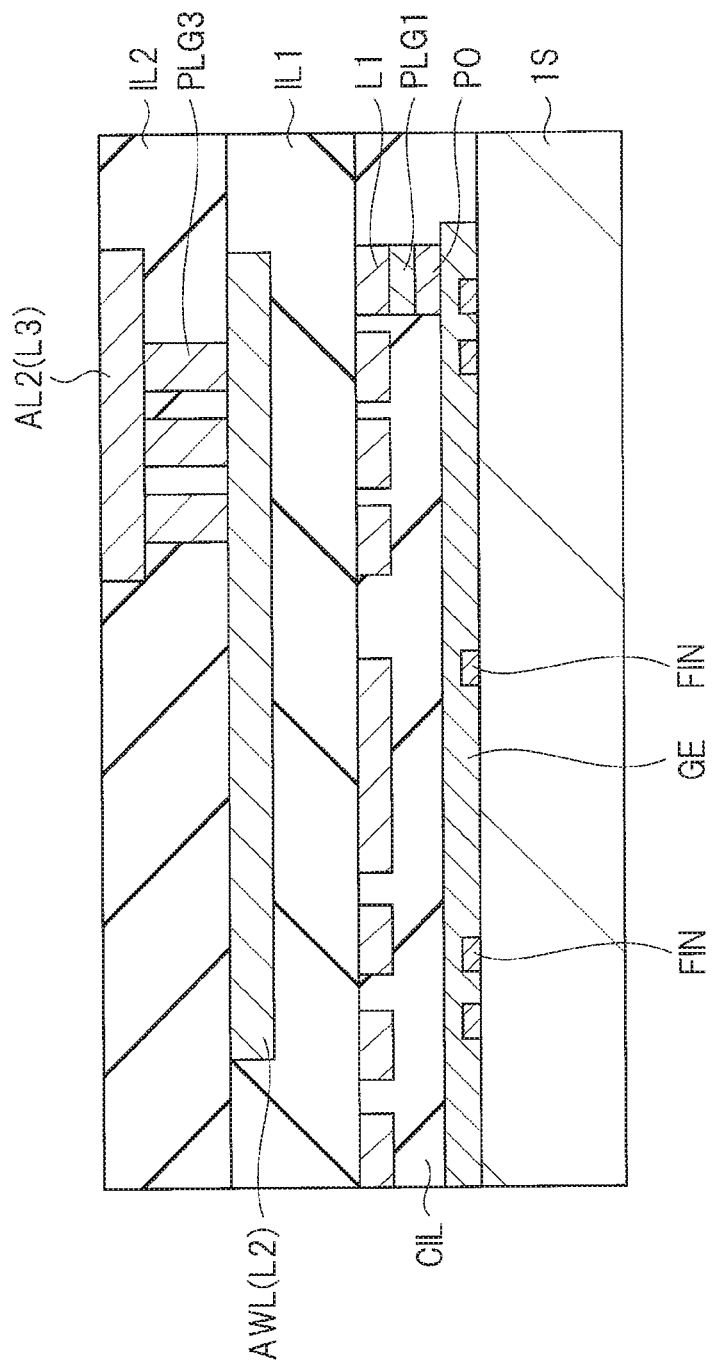
FIG. 24 is a cross-sectional view cut along a line B-B illustrated in FIG. 22(b).

FIG. 24 is a cross-sectional view cut along a line B-B illustrated in FIG. 22(b). As illustrated in FIG. 24, the fins FIN and the gate electrode GE are formed on the semiconductor substrate 1S, and a contact interlayer insulating film CIL is formed to cover the gate electrode GE. The plurality of wirings L1 are formed in the contact interlayer insulating film CIL.

Subsequently, an interlayer insulating film IL1 is formed on the contact interlayer insulating film CIL including the respective upper portions of the plurality of wirings L1, and the word line AWL is formed in the interlayer insulating film IL1. An interlayer insulating film IL2 is formed on the interlayer insulating film IL1 including the upper portion of the word line AWL, and a plurality of plugs PLG3 and the auxiliary line AL2 are formed in the interlayer insulating film IL2. At this time, the word line AWL and the auxiliary line AL2 are electrically connected to each other by the plurality of plugs PLG3.

<Features in Fourth Embodiment>

In the present fourth embodiment, it is assumed to use the memory cell in the dual port SRAM including a plurality of ports for writing or reading the information. A feature point in the present fourth embodiment is that, for example, the memory cell in the dual port SRAM includes the auxiliary line AL2 electrically connected to the word line AWL and the auxiliary line AL1 electrically connected to the word line BWL, and the auxiliary line AL1 and the auxiliary line AL2 are alternately arranged in a plan view as illustrated in FIG. 22.

Thus, first, in the present fourth embodiment, the auxiliary line AL2 electrically connected to the word line AWL is provided, and therefore, the resistance of the word line AWL can be decreased. Similarly, in the present fourth embodiment, the auxiliary line AL1 electrically connected to the word line BWL is provided, and therefore, the resistance of the word line BWL can be decreased. Therefore, in the present fourth embodiment, the respective resistances of the two word lines AWL and BWL existing in the memory cell in the dual port SRAM can be decreased. Here, the dual port SRAM itself has an advantage in that data processing can be performed at high speed because it can simultaneously perform a reading operation and a writing operation using the two ports. Thus, while the dual port SRAM in the present fourth embodiment can also obtain the above-described advantage, the respective resistances of the two word lines AWL and BWL can be further decreased according to the present fourth embodiment. Therefore, in this manner, a higher speed operation can be achieved.

Here, from the viewpoint of decreasing the respective resistances of the two word lines AWL and BWL, it appears to be desirable to completely extend the auxiliary line AL2 over the word line AWL and to completely extend the auxiliary line AL1 over the word line BWL. In this point, the present fourth embodiment does not have such a configuration, and, for example, the auxiliary line AL1 and the auxiliary line AL2 are alternately arranged in a plan view as illustrated in FIG. 22(b). This is because of the following reason. That is, in the dual port SRAM, the reading operation and the writing operation are simultaneously performed by using the two ports. Thus, simultaneous application of a voltage to the two word lines AWL and BWL adjacent to each other can be considered. In this case, a crosstalk occurs between the two word lines AWL and BWL adjacent to each other. That is, when the auxiliary line AL1 and the auxiliary line AL2 are not alternately arranged in a plan view, a crosstalk occurs between the two word lines AWL and BWL adjacent to each other, and a crosstalk also occurs between the auxiliary line AL1 and the auxiliary line AL2. As a result, the operation reliability of the dual port SRAM decreases. Therefore, in the present fourth embodiment, while the memory cell in the dual port SRAM includes the auxiliary line AL2 electrically connected to the word line AWL and the auxiliary line AL1 electrically connected to the word line BWL, the auxiliary line AL1 and the auxiliary line AL2 are alternately arranged in a plan view. As a result, according to the present fourth embodiment, the respective resistances of the word line AWL and the word line BWL can be decreased by the existence of the auxiliary line AL1 and the auxiliary line AL2, and a crosstalk between the auxiliary line AL1 and the auxiliary line AL2 can be suppressed by alternately arranging the auxiliary line AL1 and the auxiliary line AL2.

As described above, according to the dual port SRAM in the present fourth embodiment, a high-speed operation by decreasing the respective resistances of the two word lines (AWL, BWL) can be achieved while the decrease in the operation reliability due to the crosstalk is suppressed.

In the foregoing, the invention made by the present inventors has been concretely described based on the embodiments. However, it is needless to say that the present invention is not limited to the foregoing embodiments and various modifications and alterations can be made within the scope of the present invention.

REFERENCE SIGNS LIST

1S Semiconductor substrate
AL Auxiliary line
CIL Contact interlayer insulating film
DL Diffusion layer
GE2 Gate electrode
GE4 Gate electrode
IL1 Interlayer insulating film
IL2 Interlayer insulating film
OD On-substrate wiring
PLG1 Plug
PLG2 Plug
PLG3A Plug
PLG3B Plug
PO Directly-above wiring
VL2 Power supply line
VL3 Power supply line
VSS Wiring
WL Word line.

The invention claimed is:

1. A semiconductor device comprising:
a semiconductor substrate;
an active region integrally formed with the semiconductor substrate, extended in a first direction, and including a source region and a drain region of a field effect transistor;
a gate wiring bridging over the active region, extended in a second direction crossing the first direction, and constituting a gate electrode of the field effect transistor;
a memory cell including the field effect transistor;
a pair of bit lines connected to the memory cell and extended in the first direction;
a word line connected to the memory cell and extended in the second direction;
a contact interlayer insulating film formed so as to cover the gate wiring;
a first interlayer insulating film formed on the contact interlayer insulating film; and
a second interlayer insulating film formed on the first interlayer insulating film,
wherein the pair of bit lines are disposed in a first wiring layer on the contact interlayer insulating film,
wherein the word line includes:
a first wiring disposed in a second wiring layer on the first interlayer insulating film; and
a second wiring disposed in a third wiring layer on the second interlayer insulating film, and
wherein the first wiring and the second wiring are electrically connected via a first plug formed in the second interlayer insulating film.

2. The semiconductor device according to claim 1, wherein the active region comprises a fin integrally formed with the semiconductor substrate and protruded from the semiconductor substrate.

3. The semiconductor device according to claim 1,
wherein the memory cell comprises a static random access memory, and
wherein the field effect transistor comprises a transfer MISFET (Metal-Insulator-Semiconductor Field-Effect Transistor) of the memory cell.

4. A semiconductor device comprising:
a semiconductor substrate,
first and second fins formed on the semiconductor substrate;
a first gate electrode bridging over the first fin and extended in a first direction;
a second gate electrode bridging over the second fin and extended in the first direction;
a first FINFET (Fin Field-Effect Transistor) including the first fin and the first gate electrode;
a second FINFET including the second fin and the second gate electrode;
a memory cell including the first FINFET;
a memory array including:
the memory cell;
a bit line pair connected to the memory cell; and a word line connected to the memory cell, and including a sixth wiring and a seventh wiring;
a first wiring connected to the first gate electrode;
an I/O (Input/Output) circuit configured to perform a read operation or a write operation on the memory cell, the I/O circuit including:
the second FINFET;
a second wiring connected to the second gate electrode;
a third wiring connected to the second wiring;
a fourth wiring connected to the third wiring, and
a fifth wiring connected to the fourth wiring,
a contact interlayer insulating film formed on the semiconductor substrate and covering the first gate electrode and the second gate electrode;
a lowermost wiring layer formed in the contact interlayer insulating film, and including the first wiring and the second wiring,
a first wiring layer formed in the contact interlayer insulating film, and formed on the lowermost wiring layer,
a first insulating film formed on the contact interlayer insulating film;
a second wiring layer formed in the first insulating film and,
a second insulating film formed on the first insulating film; and
a third wiring layer formed in the second insulating film,
wherein the bit line pair is formed in the first wiring layer and extended in a second direction crossing the first direction;
wherein the third wiring is formed in the first wiring layer and extended in the second direction,
wherein the fourth wiring is formed in the second wiring layer and extended in the first direction,
wherein the fifth wiring is formed in the third wiring layer and extended in the second direction,
wherein the sixth wiring is formed in the second wiring layer and extended in the first direction; and
wherein the seventh wiring is formed in the third wiring layer and extended in the first direction,
wherein the sixth wiring and the seventh wiring are electrically connected to each other via a first plug formed in the second insulating film.

5. The semiconductor device according to claim 4,
wherein the seventh wiring is comprised of a first partial wiring and a second partial wiring which are arranged in a straight line and spaced apart from each other in a plan view.

6. The semiconductor device according to claim 5, further including a crossing wiring disposed in the third wiring layer,
wherein the crossing wiring passes between the first partial wiring and the second partial wiring, and extends in the second direction.

7. The semiconductor device according to claim 4, wherein the I/O (Input/Output) circuit includes a word driver connected to the memory cell via the sixth wiring and the seventh wiring, and
wherein the sixth wiring and the seventh wiring are electrically connected to each other via a plurality of second plugs formed in the second insulating film.

8. The semiconductor device according to claim 4, wherein the sixth wiring and the seventh wiring are arranged to overlap each other in plan view.

9. The semiconductor device according to claim 4, further comprising a first power supply line connected to the memory cell and supplying a first voltage to the memory cell,
wherein the first power supply line includes an eighth wiring extended in the first direction and disposed in the second wiring layer.

10. The semiconductor device according to claim 9, wherein the first power supply line further includes a ninth wiring extended in the first direction and disposed in the third wiring layer, and
wherein the eighth wiring and the ninth wiring are electrically connected to each other via a third plug formed in the second insulating film.

11. The semiconductor device according to claim 10, wherein the eighth wiring and the ninth wiring are electrically connected to each other via a plurality of fourth plugs formed in the second insulating film.

12. A semiconductor device comprising:
a semiconductor substrate;
first and a second fins formed on the semiconductor substrate;
a first gate electrode bridging over the first fin and extended in a first direction;
a second gate electrode bridging over the second fin and extended in the first direction;
a first FINFET (Fin Field-Effect Transistor) including the first fin and the first gate electrode;
a second FINFET including the second fin and the second gate electrode;
a memory cell including the first FINFET;
a memory array including:
the memory cell;
a bit line pair connected to the memory cell; and
a word line connected to the memory cell;
a first wiring connected to the first gate electrode;
an I/O (Input/Output) circuit configured to perform a read operation or a write operation on the memory cell, the I/O circuit including:
the second FINFET;
a second wiring connected to the second gate electrode;
a third wiring connected to the second wiring;
a fourth wiring connected to the third wiring, and
a fifth wiring connected to the fourth wiring,
a contact interlayer insulating film formed on the semiconductor substrate and covering the first gate electrode and the second gate electrode;
a lowermost wiring layer formed in the contact interlayer insulating film, and including the first wiring and the second wiring;
a first wiring layer formed in the contact interlayer insulating film, and formed on the lowermost wiring layer;
a first insulating film formed on the contact interlayer insulating film;
a second wiring layer formed in the first insulating film;
a second insulating film formed on the first insulating film;
a third wiring layer formed in the second insulating film; and
a sixth wiring formed in the third wiring layer and extended in the first direction;
wherein the bit line pair is formed in the first wiring layer and extended in a second direction crossing the first direction;
wherein the third wiring is formed in the first wiring layer and extended in the second direction, wherein the fourth wiring is formed in the second wiring layer and extended in the first direction, wherein the fifth wiring is formed in the third wiring layer and extended in the second direction, wherein the word line is formed in the second wiring layer and extended in the first direction, and wherein the word line is arranged to overlap with the sixth wiring, and is not connected to the sixth wiring electrically.

13. The semiconductor device according to claim 12, further comprising a first power supply line connected to the memory cell and supplying a first voltage to the memory cell, wherein the first power supply line includes a seventh wiring extended in the first direction and disposed in the second wiring layer.

14. The semiconductor device according to claim 13, wherein the first power supply line further includes an eighth wiring extended in the first direction and disposed in the third wiring layer, and wherein the seventh wiring and the eighth wiring are electrically connected to each other via a first plug formed in the second insulating film.

15. The semiconductor device according to claim 14, wherein the seventh wiring and the eighth wiring are electrically connected to each other via a plurality of second plugs formed in the second insulating film.

16. The semiconductor device according to claim 1, wherein the first wiring and the second wiring are electrically connected via a second plug formed in the second interlayer insulating film.

17. The semiconductor device according to claim 1, wherein the first wiring and the second wiring overlap each other.

18. The semiconductor device according to claim 1, further comprising a first power supply line connected to the memory cell and supplying a first voltage to the memory cell.

19. The semiconductor device according to claim 1, wherein a space is configured in the third wiring layer.

20. The semiconductor device according to claim 4, wherein a space is configured in the third wiring layer.

21. A semiconductor device comprising:

a semiconductor substrate;

an active region integrally formed with the semiconductor substrate, extended in a first direction, and including a first region of a first electrode of a principal electrically conducting channel and a second region of a second electrode of the principal electrically conducting channel of a transistor;

a control wiring bridging over the active region, extended in a second direction crossing the first direction, and constituting a control electrode regulating a current flow between the first electrode and the second electrode of the principal electrically conducting channel of the transistor;

a memory cell including the transistor;

a pair of bit lines connected to the memory cell and extended in the first direction;

a word line connected to the memory cell and extended in the second direction;

a contact interlayer insulating film formed so as to cover the control wiring;

a first interlayer insulating film formed on the contact interlayer insulating film; and a second interlayer insulating film formed on the first interlayer insulating film, wherein the pair of bit lines are disposed in a first wiring layer on the contact interlayer insulating film, wherein the word line includes:

a first wiring disposed in a second wiring layer on the first interlayer insulating film; and a second wiring disposed in a third wiring layer on the second interlayer insulating film, and wherein the first wiring and the second wiring are electrically connected via a first plug formed in the second interlayer insulating film.

* * * * *